US012759881B2

(12) United States Patent
Su et al.

(10) Patent No.: US 12,759,881 B2
(45) Date of Patent: Oct. 13, 2026

(54) FABRICATION OF NANOTUBE BUNDLES AND REACTORS FOR THE SAME

(71) Applicant: Taiwan Semiconductor Manufacturing Co., Ltd., Hsinchu (TW)

(72) Inventors: Dung-Yue Su, Hsinchu (TW); Pei-Cheng Hsu, Hsinchu (TW); Huan-Ling Lee, Hsinchu (TW); Hsin-Chang Lee, Hsinchu (TW)

(73) Assignee: FABRICATION OF NANOTUBE BUNDLES AND REACTORS FOR THE SAME, Hsinchu (TW)

( * ) Notice: Subject to any disclaimer, the term of this patent is extended or adjusted under 35 U.S.C. 154(b) by 629 days.

(21) Appl. No.: 18/357,950

(22) Filed: Jul. 24, 2023

(65) Prior Publication Data

US 2024/0351881 A1 Oct. 24, 2024

Related U.S. Application Data

(60) Provisional application No. 63/497,970, filed on Apr. 24, 2023.

(51) Int. Cl.

*C01B 32/168* (2017.01)
*C01B 32/162* (2017.01)
*G03F 1/62* (2012.01)

(52) U.S. Cl.

CPC .......... *C01B 32/168* (2017.08); *C01B 32/162* (2017.08); *G03F 1/62* (2013.01); *C01B 2202/08* (2013.01)

(58) Field of Classification Search

CPC . C01B 32/168; C01B 32/162; C01B 2202/08; G03F 1/62

See application file for complete search history.

(56) References Cited

U.S. PATENT DOCUMENTS

2023/0236496 A1* 7/2023 Hsu .......................... C01B 32/162 430/5

FOREIGN PATENT DOCUMENTS

KR 20210118959 A 10/2021
KR 20220097522 A 7/2022

* cited by examiner

*Primary Examiner* — Stewart A Fraser
(74) *Attorney, Agent, or Firm* — Seed Intellectual Property Law Group LLP

(57) ABSTRACT

A method for forming a pellicle for an extreme ultraviolet lithography mask is provided. The method includes forming a pellicle membrane over a filter membrane and transfer the pellicle membrane from the filter membrane to a membrane border. Forming the pellicle membrane includes growing carbon nanotubes (CNTs) from in-situ formed metal catalyst particles in a first reaction zone of a reactor, each of the CNTs including a metal catalyst particle at a growing tip thereof, promoting formation of bundles of nanotubes from the individual CNTs in a second zone of the reactor downstream of the first reaction zone. The bundled CNTs are then collected on the filter membrane.

20 Claims, 19 Drawing Sheets

FABRICATION OF NANOTUBE BUNDLES AND REACTORS FOR THE SAME

PRIORITY CLAIM AND CROSS-REFERENCE

This application claims the benefit of U.S. Provisional Patent Application No. 63/497,970, filed Apr. 24, 2023, which is incorporated by reference herein in its entirety.

BACKGROUND

In the semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
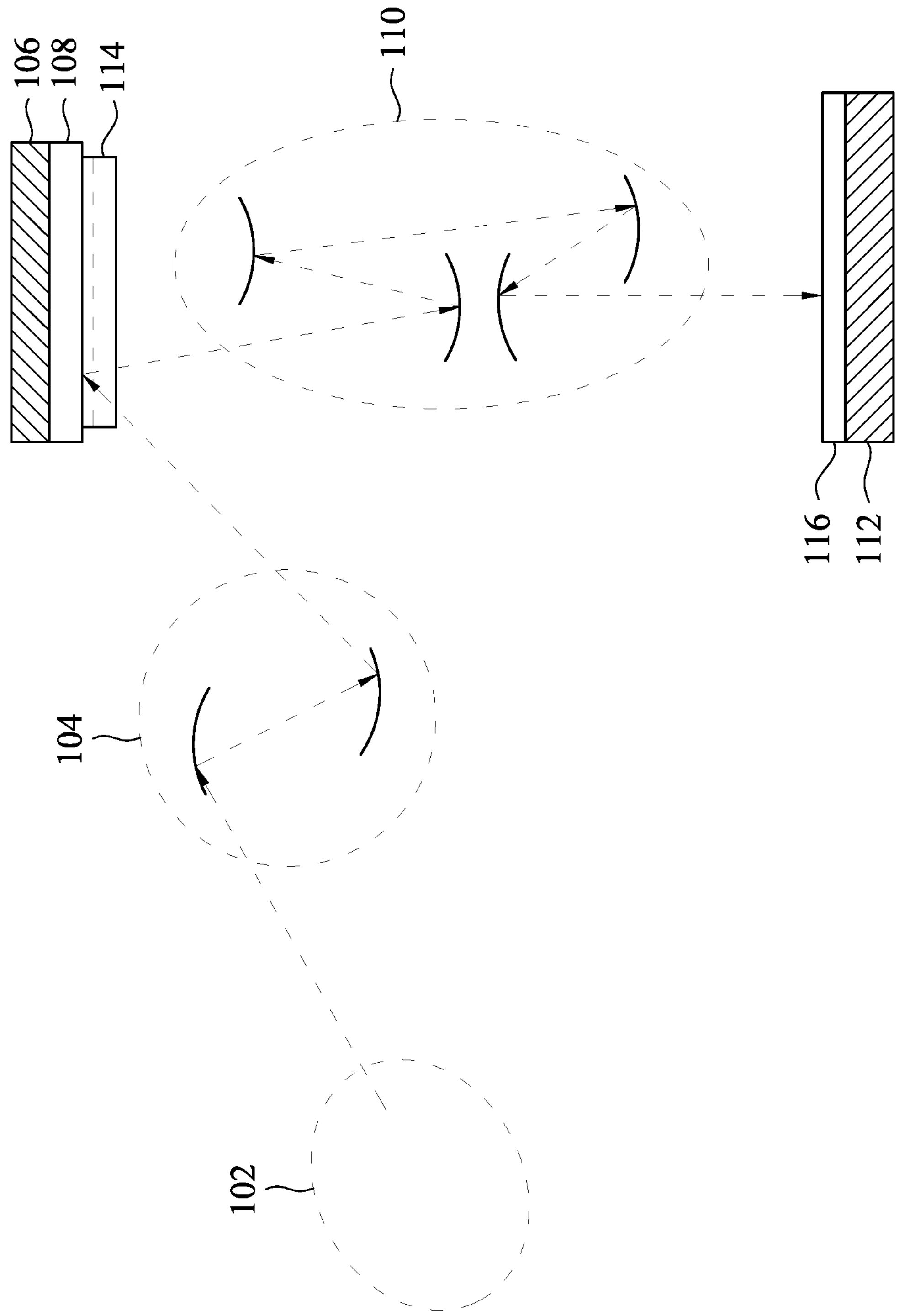
FIG. 1 is a schematic diagram of a lithography system, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In semiconductor fabrication, various lithographic processes are extensively used in the course of defining devices and circuit patterns. Depending on the size of the features to be defined, different optical lithographic processes may be used. In a lithographic process, a pattern present on a photomask or reticle may be transferred to a light-sensitive photoresist coating by illuminating the photomask. The light is modulated by the reticle pattern and imaged onto a photoresist-coated wafer. In general, as the patterns become smaller, shorter wavelengths are utilized. In extreme ultraviolet (EUV) lithography, a wavelength of about 13.5 nm is frequently used to produce feature sizes of less than 32 nanometers.

However, EUV systems, which utilize reflective rather than conventional refractive optics, are very sensitive to contamination issues. In one example, particle contamination introduced onto a reflective EUV mask can result in significant degradation of the lithographically transferred pattern. As such, it is necessary to provide a pellicle membrane over an EUV mask, to serve as a protective cover which protects the EUV mask from damage and/or contaminant particles. Additionally, to avoid a drop on reflectivity, it is important to use a thin, high-transmission material as the pellicle membrane.

Carbon nanotubes (CNTs), being transparent enough to limit the imaging impact while robust enough to survive handling and capable of stopping particles from falling on the photomask, have been used as pellicle membrane materials for EUV lithography. However, CNTs are vulnerable to the hydrogen plasma environment of the EUV scanner during a large number of exposure, e.g., on the order of tens of thousands or more.

Embodiments of the present disclosure provide methods of manufacturing a pellicle membrane formed of a network of bundled nanotubes. The nanotubes used to form the bundled nanotubes can be carbon nanotubes, i.e., CNTs. In other embodiments, the nanotubes can include a core-shell structure including a CNT as the core and a boron nitride nanotube (BNNT) as the shell. The boron nitride has higher chemical and thermal stabilities than the carbon, and thus helps to prevent damages of the carbon nanotube core by EUV exposure and hydrogen flow. The methods of the present disclosure allow growing the CNT and forming bundles of the formed CNTs. As a result, the EUV transmission, reliability and lifespan of the pellicle membrane are improved. Bundled nanotubes formed in accordance with embodiments described herein are useful in applications other than as a pellicle for a mask used in lithography processes. For example, bundled nanotubes of the present disclosure are useful in transistors, touch screens, touch sensors, electrochemical sensors, heaters, x-ray filters or windows, displays and other devices that utilize bundled nanotubes, such as bundled CNTs.

FIG. 1 is a schematic diagram of a lithography system 100, in accordance with some embodiments of the present disclosure. The lithography system 100 may also be referred to herein as a "scanner" that is operable to perform lithography exposing processes with respective radiation sources and exposure modes.

In some embodiments, the lithography system 100 includes a high-brightness light source 102, an illuminator 104, a mask stage 106, a photomask 108, a projection optics module 110, and a substrate stage 112. In some embodiments, the lithography system may include additional components that are not illustrated in FIG. 1. In further embodiments, one or more of the high-brightness light source 102, the illuminator 104, the mask stage 106, the photomask 108, the projection optics module 110, and the substrate stage 112 may be omitted from the lithography system 100 or may be integrated into combined components.

The high-brightness light source 102 may be configured to emit radiation having wavelengths in the range of approximately 1 nanometer (nm) to 250 nm. In some embodiments, the high-brightness light source 102 generates EUV light with a wavelength centered at approximately 13.5 nanometers; accordingly, the high-brightness light source 102 may also be referred to as an "EUV light source." However, it will be appreciated that the high-brightness light source 102 should not be limited to emitting EUV light. For instance, the high-brightness light source 102 may be utilized to perform any high-intensity photon emission from excited target material.

In embodiments, for example, where the lithography system 100 is a UV lithography system, the illuminator 104 comprises various refractive optical components, such as a single lens or a lens system comprising multiple lenses (zone plates). In embodiments, for example, where the lithography system 100 is an EUV lithography system, the illuminator 104 comprises various reflective optical components, such as a single mirror or a mirror system comprising multiple mirrors. The illuminator 104 may direct light from the high-brightness light source 102 onto the mask stage 106, and more particularly onto the photomask 108 that is secured onto the mask stage 106. In an example where the high-brightness light source 102 generates light in the EUV wavelength range, the illuminator 104 comprises reflective optics.

The mask stage 106 may be configured to secure the photomask 108. In some examples, the mask stage 106 may include an electrostatic chuck (e-chuck) to secure the photomask 108. This is because the gas molecules absorb EUV light, and the lithography system 100 for EUV lithography patterning is maintained in a vacuum environment to minimize EUV intensity loss. Herein, the terms "photomask," "mask," and "reticle" may be used interchangeably. In some embodiments, the photomask 108 is a reflective mask.

In some examples, a pellicle 114 may be positioned over the photomask 108, e.g., between the photomask 108 and the substrate stage 112. The pellicle 114 may protect the photomask 108 from particles and may keep the particles out of focus, so that the particles do not produce an image (which may cause defects on a wafer during the lithography process).

The projection optics module 110 may be configured for imaging the pattern of the photomask 108 onto a semiconductor wafer 116 secured on the substrate stage 112. In some embodiments, the projection optics module 110 comprises refractive optics (such as for a UV lithography system). In some embodiments, the projection optics module 110 comprises reflective optics (such as for an EUV lithography system). The light directed from the photomask 108, carrying the image of the pattern defined on the photomask 108, may be collected by the projection optics module 110. The illuminator 104 and the projection optics module 110 may be collectively referred to as an "optical module" of the lithography system 100.

In some embodiments, the semiconductor wafer 116 may be a bulk semiconductor wafer. For instance, the semiconductor wafer 116 may comprise a silicon wafer. The semiconductor wafer 116 may include silicon or another elementary semiconductor material, such as germanium. In some embodiments, the semiconductor wafer 116 may include a compound semiconductor. The compound semiconductor may include gallium arsenide, silicon carbide, indium arsenide, indium phosphide, another suitable material, or a combination thereof. In some embodiments, the semiconductor wafer 116 includes a silicon-on-insulator (SOI) substrate. The SOI substrate may be fabricated using a separation by implantation of oxygen (SIMOX) process, a wafer bonding process, another applicable process, or a combination thereof. In some embodiments, the semiconductor wafer 116 comprises an undoped substrate. However, in other embodiments, the semiconductor wafer 116 comprises a doped substrate, such as a p-type substrate or an n-type substrate.

In some embodiments, the semiconductor wafer 116 includes various doped regions (not shown) depending on the design requirements of the semiconductor device structure. The doped regions may include, for example, p-type wells and/or n-type wells. In some embodiments, the doped regions are doped with p-type dopants. For example, the doped regions may be doped with boron or boron fluoride. In other examples, the doped regions are doped with n-type dopants. For example, the doped regions may be doped with phosphor or arsenic. In some examples, some of the doped regions are p-doped and other doped regions are n-doped.

In some embodiments, an interconnection structure may be formed over the semiconductor wafer 116. The interconnection structure may include multiple interlayer dielectric layers, including dielectric layers. The interconnection structure may also include multiple conductive features formed in the interlayer dielectric layers. The conductive features may include conductive lines, conductive vias, and/or conductive contacts.

In some embodiments, various device elements are formed in the semiconductor wafer 116. Examples of the various device elements may include transistors (e.g., metal oxide semiconductor field effect transistors (MOSFETs), complementary metal oxide semiconductor (CMOS) transistors, bipolar junction transistors (BJTs), high-voltage transistors, high-frequency transistors, p-channel and/or n-channel field effect transistors (PFETs and/or NFETs), diodes, or other suitable elements. Various processes may be used to form the various device elements, including deposition, etching, implantation, photolithography, annealing, and/or other applicable processes.

The device elements may be interconnected through the interconnection structure over the semiconductor wafer 116 to form integrated circuit devices. The integrated circuit devices may include logic devices, memory devices (e.g., static random access memory (SRAM) devices), radio frequency (RF) devices, input/output (I/O) devices, system-on-chip (SoC) devices, image sensor devices, other applicable devices, or a combination thereof.

In some embodiments, the semiconductor wafer 116 may be coated with a resist layer that is sensitive to EUV light. Various components including those described above may be integrated together and may be operable to perform lithography exposing processes.

Figure 2A:
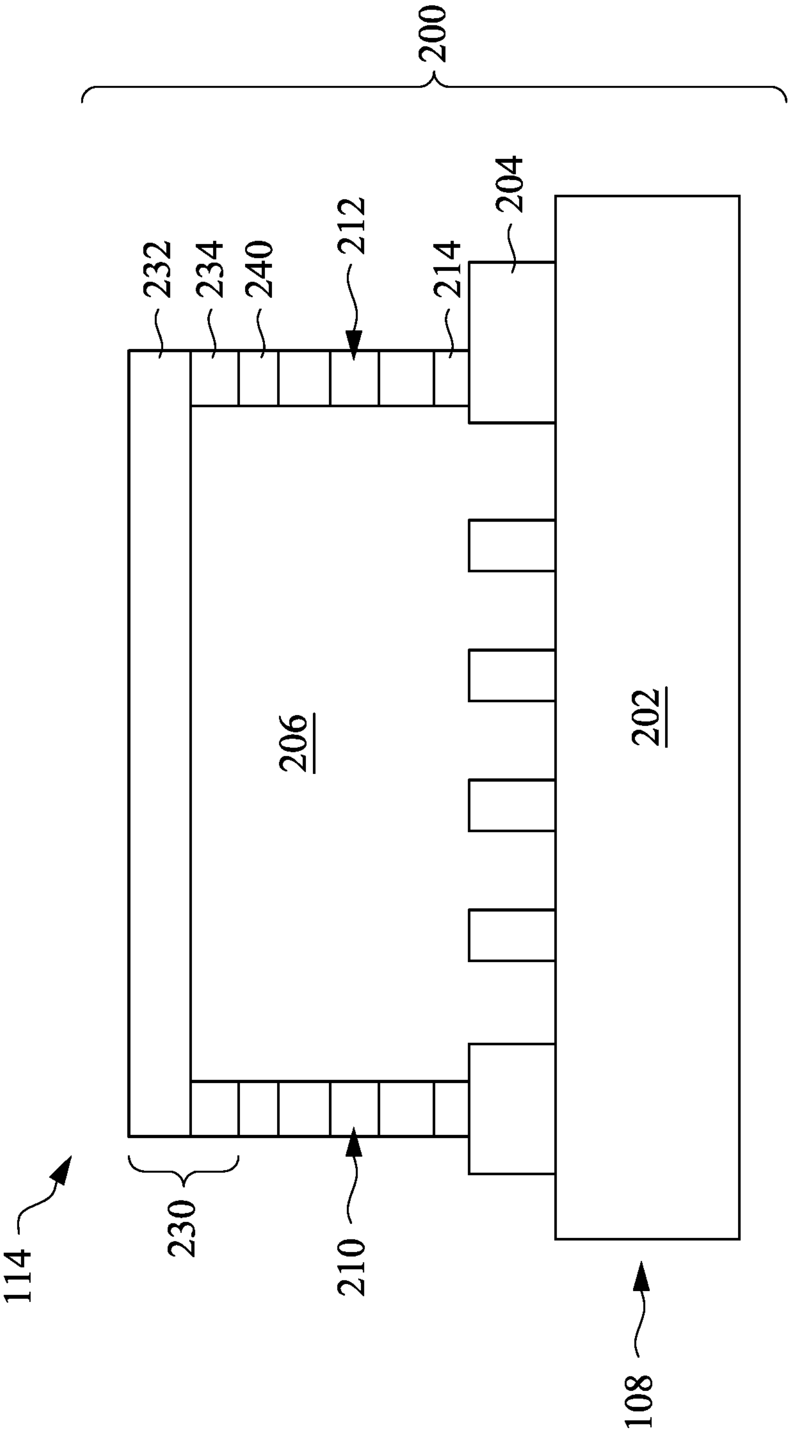
FIG. 2A is a cross-sectional view of a pellicle-photomask structure, in accordance with some embodiments of the present disclosure.

FIG. 2A is a cross-sectional view of a pellicle-photomask structure 200, in accordance with some embodiments of the present disclosure. As illustrated in FIG. 2A, the photomask 108 may include a mask substrate 202 and a mask pattern 204 positioned over the mask substrate 202.

In some examples, the mask substrate 202 comprises a transparent substrate, such as fused silica that is relatively free of defects, borosilicate glass, soda-lime glass, calcium fluoride, low thermal expansion material, ultra-low thermal expansion material, or other applicable materials. The mask pattern 204 may be positioned over the mask substrate 202 as discussed above and may be designed according to the integrated circuit features to be formed over a semiconductor substrate (e.g., semiconductor wafer 116 of FIG. 1) during a lithography process. The mask pattern 204 may be formed by depositing a material layer and patterning the material layer to have one or more openings where beams of radiation may travel through without being absorbed, and one or more absorption areas which may completely or partially block the beams of radiation.

The mask pattern 204 may include metal, metal alloy, metal silicide, metal nitride, metal oxide, metal oxynitride, or other applicable materials. Examples of materials that may be used to form the mask pattern 204 may include, but are not limited to, Cr, $Mo_xSi_y$, $Ta_xSi_y$, Mo, $Nb_xO_y$, Ti, Ta, $Cr_xN_y$, $Mo_xO_y$, $Mo_xN_y$, $Cr_xO_y$, $Ti_xN_y$, $Zr_xN_y$, $Ti_xO_y$, $Ta_xN_y$, $Ta_xO_y$, $Si_xO_y$, $Nb_xN_y$, $Zr_xN_y$, $Al_xO_yN_z$, $Ta_xB_yO_z$, $Ta_xB_yN_z$, $Ag_xO_y$, $Ag_xN_y$, Ni, $Ni_xO_y$, $Ni_xO_yN_z$, and/or the like. The compound x/y/z ratio is not limited.

In some embodiments, the photomask 108 is an EUV mask. However, in other embodiments, the photomask 108 may be an optical mask.

As illustrated in FIG. 2A, the pellicle 114 may be positioned over the photomask 108, thereby forming an enclosed inner volume 206 that is enclosed by the pellicle 114 and the photomask 108.

In some embodiments, the pellicle 114 includes a pellicle frame 210 that may be positioned over at least one of the mask substrate 202 and the mask pattern 204. The pellicle frame 210 may be designed in various dimensions, shapes, and configurations. In some embodiments, the pellicle frame 210 may have a round shape, a rectangular shape, or any other suitable shape. In some embodiments, the pellicle frame 210 may be formed from Si, SiC, SiN, glass, a low coefficient of thermal expansion material (such as an Al alloy, a Ti alloy, Invar, Kovar, or the like), another suitable material, or a combination thereof. In some embodiments, suitable processes for forming the pellicle frame 210 may include machining processes, sintering processes, photochemical etching processes, other applicable processes, or a combination thereof.

As further illustrated in FIG. 2A, the pellicle 114 may further include a vent structure 212 extending through the pellicle frame 210. In some embodiments, the vent structure 212 may comprise one or more apertures formed through the pellicle frame 210. The apertures may take any shape, including circular apertures, rectangular apertures, slit-shaped apertures, other shapes, or any combination thereof. The apertures may allow for a flow of air through a portion of the pellicle-photomask structure 200. In some embodiments, the apertures may include filters to minimize passage of outside particles through the vent structure 212. In some embodiments, the vent structure 212 may prevent the pellicle membrane from rupturing during the EUV lithography process.

As further illustrated in FIG. 2A, the pellicle frame 210 is attached to photomask 108 by a pellicle frame adhesive 214. In some embodiments, the pellicle frame adhesive 214 may be formed from a crosslink type adhesive, a thermoplastic elastomer type adhesive, a polystyrene type adhesive, an acrylic type adhesive, a silicon-based adhesive, an epoxy type adhesive, or a combination thereof.

In some embodiments, a surface treatment may be performed on the pellicle frame 210 to enhance the adhesion of the pellicle frame 210 to the pellicle frame adhesive 214. In some examples, the surface treatment may include an oxygen plasma treatment, another applicable treatment, or a combination thereof. However, in other examples, no surface treatment may be performed on the pellicle frame 210.

As further illustrated in FIG. 2A, the pellicle 114 may further include a pellicle membrane assembly 230 including a pellicle membrane 232 and a membrane border 234 positioned over the pellicle frame 210. The pellicle membrane 232 extends over the pattern region of the photomask 108 to protect the pattern region from contaminant particles. Particles unintentionally deposited on the pattern region of the photomask 108 may introduce defects and result in degradation of the transferred patterns. Particles may be introduced by any of a variety of ways, such as during a cleaning process, and/or during handling of the photomask 108. By keeping the contaminant particles out of the focal plane of the photomask 108, a high fidelity pattern transfer from the photomask 108 to the semiconductor wafer 116 (FIG. 1) can be achieved.

As illustrated in FIG. 2A, a pellicle membrane adhesive 240 may be positioned between the membrane border 234 and the pellicle frame 210, attaching the pellicle membrane 232 to the pellicle frame 210. In some embodiments, the pellicle membrane adhesive 240 may be formed from a thermoplastic elastomer type adhesive, a polystyrene type adhesive, an acrylic type adhesive, a silicon-based adhesive, an epoxy type adhesive, another suitable adhesive, or a combination thereof. In some embodiments, the pellicle membrane adhesive 240 may be formed from a material that is different from the material making up the pellicle frame adhesive 214.

The membrane border 234 may be attached around the periphery of the pellicle membrane 232, and thus mechanically supports the pellicle membrane 232. The membrane border 234 may, in turn, be mechanically supported by the pellicle frame 210 when the pellicle-photomask structure 200 is fully assembled. That is, the pellicle frame 210 may mechanically support the membrane border 234 and the pellicle membrane 232 on the photomask 108.

In some embodiments, the membrane border 234 may be formed from Si. In further examples, the membrane border 234 may be formed from boron carbide, graphene, carbon nanotube, SiC, SiN, $SiO_2$, SiON, Zr, Nb, Mo, Cd, Ru, Ti, Al, Mg, V, Hf, Ge, Mn, Cr, W, Ta, Ir, Zn, Cu, F, Co, Au, Pt, Sn, Ni, Te, Ag, another suitable material, an allotrope of any of these materials, or a combination thereof.

Figure 2B:
FIG. 2B illustrates a pellicle membrane of FIG. 2A, in accordance with some embodiments.

In embodiments of the present disclosure, the pellicle membrane 232 is formed by one or more of bundled nanotube layers. Each bundled nanotube layer may include a random or regular web or grid of bundled nanotubes. FIG. 2B, for instance, illustrates a schematic of an exemplary pellicle membrane 232 of FIG. 2A, in accordance with some embodiments of the present disclosure. In the example illustrated in FIG. 2B, the pellicle membrane 232 comprises a network of bundled nanotubes. The structure density of the bundled nanotube network is chosen to maximize EUV radiation transmission while minimizing passage of particles through the pellicle membrane 232. For example, in some embodiments, the network of bundled nanotubes making up the pellicle membrane 232 may have a structure density of between 0.2 and 1, depending on the desired percentage of radiation to be transmitted by the pellicle membrane 232. For instance, the pellicle membrane 232 has greater than 95% of EUV light transmittance.

Figure 2C:
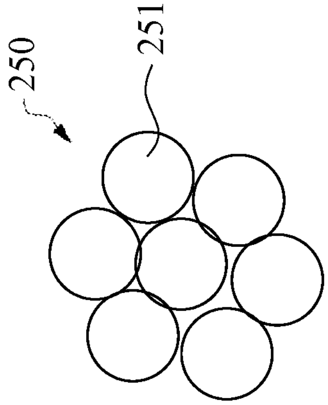
FIGS. 2C-2F illustrates a bundles of nanotubes formed in accordance with embodiments of the present disclosure.

FIG. 2C, for instance, illustrates a cross-sectional view of a bundled nanotube structure 250 of the network of pellicle membrane 232 illustrated in FIG. 2B. As illustrated, the bundled nanotube structure 250 includes a medium number of single walled nanotubes, e.g., CNTs 251. A medium number of single walled nanotubes 251 ranges from 2 to 12 individual nanotubes. Single-walled nanotubes can have many different diameters, such as from about 0.1 nm to 10 nm. Single walled nanotubes can have many different lengths, such as a length from about 10 nm to about 1 μm, from about 20 nm to about 500 nm, or from about 50 nm to about 100 nm. In some embodiments, single-walled nanotubes may have an aspect ratio (i.e., a ratio of the length of the nanotube to the diameter of the nanotube) of about 100:1 to 1000:1. An individual nanotube bundle including a medium number of individual nanotubes (i.e., a medium nanotube bundle) may have many different outer diameter sizes, such as from 10 nm to 75 nm or from 20 nm to 55 nm. An individual medium nanotube bundle may have many different lengths, such as from 100 nm to 10 μm or from 200 nm to 5.5 μm. In some embodiments, an individual medium nanotube bundle of single-walled nanotubes may have an aspect ratio (i.e., a ratio of the length of the medium nanotube bundle to the diameter of the medium nanotube bundle) of about 10:1 to 1000:1. The following descriptions refer to CNTs as examples of nanotubes useful for forming nanotube bundles in accordance with embodiments of the present disclosure. The present disclosure is not limited to CNTs as the only nanotubes that can be used to form nanotube bundles in accordance with the present disclosure.

In a medium CNT bundle, individual CNTs may be aligned and joined along their longitudinal directions. CNTs of a medium CNT bundle may also be joined end-to-end such that the length of the medium CNT bundle is greater than the length of the individual CNTs. The CNTs may typically be joined by van der Waals forces or other forces that attract the individual CNTs to each other. In some embodiments, a medium CNT bundle 250 is formed of a CNT aggregate. A CNT aggregate may include more than 10 individual CNTs joined both side-by-side and end-to-end, accordingly, both the length and diameters of the CNT aggregate are greater than the length and diameter of the individual CNTs, respectively. In some embodiments, the individual CNTs can be provided with a surrounding shell of a material, for example, a boron shell. In some embodiments, the individual CNTs are formed as a medium CNT bundle shown in FIG. 2C and a shell material surrounds all or portions of the individual medium CNT bundle 250'.

Figure 2D:
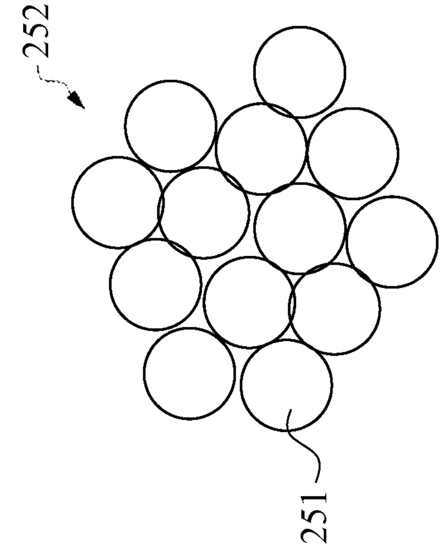

FIG. 2D, for instance, illustrates a cross-sectional view of a bundled nanotube structure 252 of the network of pellicle membrane 232 illustrated in FIG. 2B. As illustrated, the bundled nanotubes structure 252 includes a large number of single walled CNTs. A large number of single walled CNTs ranges from 13 to 20 individual CNTs. In other embodiments, a large number of single walled CNTs includes greater than 20 individual CNTs. The description above with reference to the single walled CNTs of FIG. 2C is equally applicable to the single walled CNTs of the embodiments of FIG. 2D. An individual CNT bundle 252 including a large number of individual CNTs (i.e., a large CNT bundle 252) may have many different outer diameter sizes, such as from 10 nm to 75 nm or from 20 nm to 55 nm. A large CNT bundle 252 may have many different lengths, such as from 10 μm to 100 μm or from 20 μm to 55 μm. In some embodiments, a large CNT bundle 252 of single-walled CNTs may have an aspect ratio (i.e., a ratio of the length of the large CNT bundle 252 to the diameter of the large CNT bundle 252) of about 1000:1 to 10000:1. In a large CNT bundle 252, individual CNTs may be aligned and joined along their longitudinal directions. CNTs of a large bundle may also be joined end-to-end such that the length of the large CNT bundle 252 is greater than the length of the individual CNTs 251. The CNTs may typically be joined by van der Waals forces or other forces that cause the individual CNTs to be attracted to each other. In some embodiments, a large CNT bundle 252 is formed of a CNT aggregate. A CNT aggregate may include more than 12 or more than 20 individual CNTs joined both side-by-side and end-to-end, accordingly, both the length and diameters of the CNT aggregate are greater than the length and diameter of the individual CNTs, respectively. In some embodiments, the individual CNTs of a large CNT bundle can be provided with a surrounding shell of a material, for example, a boron shell. In some embodiments, the individual CNTs are formed as a large CNT bundle shown in FIG. 2D and a shell material surrounds all or a portion of the individual large CNT bundle 252.

Figure 2F:
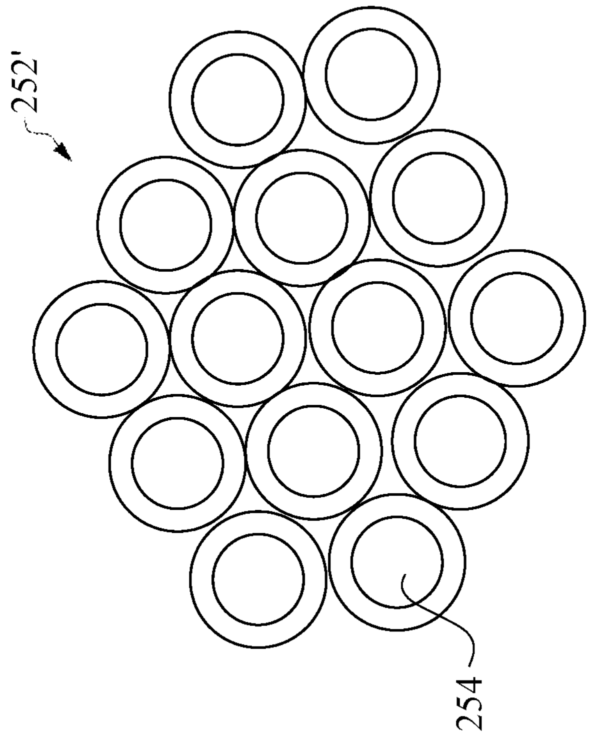
Figure 2E:
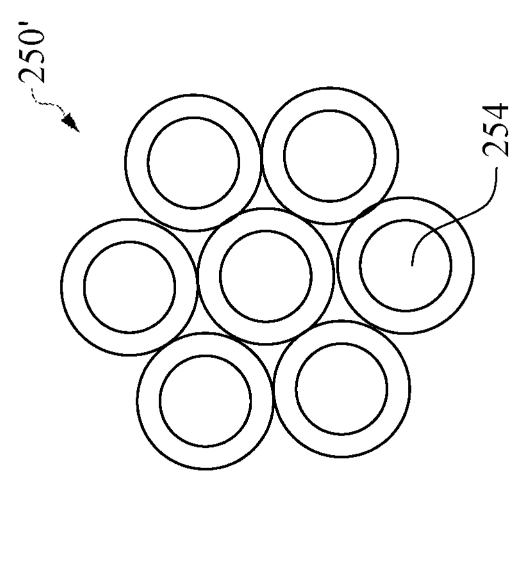

Referring to FIGS. 2E and 2F, in some embodiments, a medium CNT bundle 250' and a large CNT bundle 252' may be formed from a plurality of multi-walled nanotubes 254, e.g., double-wall nanotubes or nanotubes with more than two walls. Multi-walled CNTs 254 have multiple graphitic layers arranged generally concentrically about a common axis. The description above regarding FIGS. 2C and 2D regarding the number of individual single-walled CNTs 251 in a medium bundled CNT 250 and a large bundled CNT 252 is applicable to a bundled CNT of multi-walled CNTs in accordance with embodiments of FIGS. 2E and 2F. Diameters of multi-walled CNTs can range from about 3 nm to about 100 nm. Multi-walled CNTs may have a wide variety of lengths. For example, multi-walled CNTs may have a length from about 10 nm to about 1 μm, from about 20 nm to about 500 nm, or from about 50 nm to about 100 nm. In some embodiments, multi-walled CNTs may have an aspect ratio (i.e., a ratio of the length of the CNT to the diameter of the CNT) of about 100:1 to 1000:1. An individual CNT bundle including a medium number of individual multi-walled CNTs (i.e., a medium CNT bundle) may have many different outer diameter sizes, such as from 10 nm to 75 nm or from 20 nm to 55 nm. An individual medium CNT bundle of multi-walled CNTs may have many different lengths, such as from 100 nm to 10 μm or from 20 nm to 5.5 μm. In some embodiments, an individual medium CNT bundle of multi-walled CNTs may have an aspect ratio (i.e., a ratio of the length of the medium CNT bundle to the diameter of the medium CNT bundle) of about 10:1 to 1000:1. In a medium or large CNT bundle of multi-walled CNTs, individual CNTs may be aligned and joined along their longitudinal directions. Multi-walled CNTs of a medium or large CNT bundle may also be joined end-to-end such that the length of the resulting CNT bundle is greater than the length of the individual CNTs. The CNTs may typically be joined by van der Waals forces or other forces that cause the individual CNTs to be attracted to each other. In some embodiments, a medium CNT bundle 250' or large CNT bundle 252' of multi-walled CNTs is formed of a CNT aggregate. A CNT aggregate may include more than 10 individual CNTs joined both side-by-side and end-to-end, accordingly, both the length and diameters of the CNT aggregate are greater than the length and diameter of the individual CNTs, respectively. In some embodiments, the individual CNTs can be provided with a surrounding shell of a material, for example, a boron shell. In some embodiments, the individual CNTs are formed as a medium or large CNT bundle shown in FIGS. 2E and 2F and a shell material surrounds all or at least a portion of the individual medium CNT bundle 250' or the large CNT bundle 252'.

Figure 3:
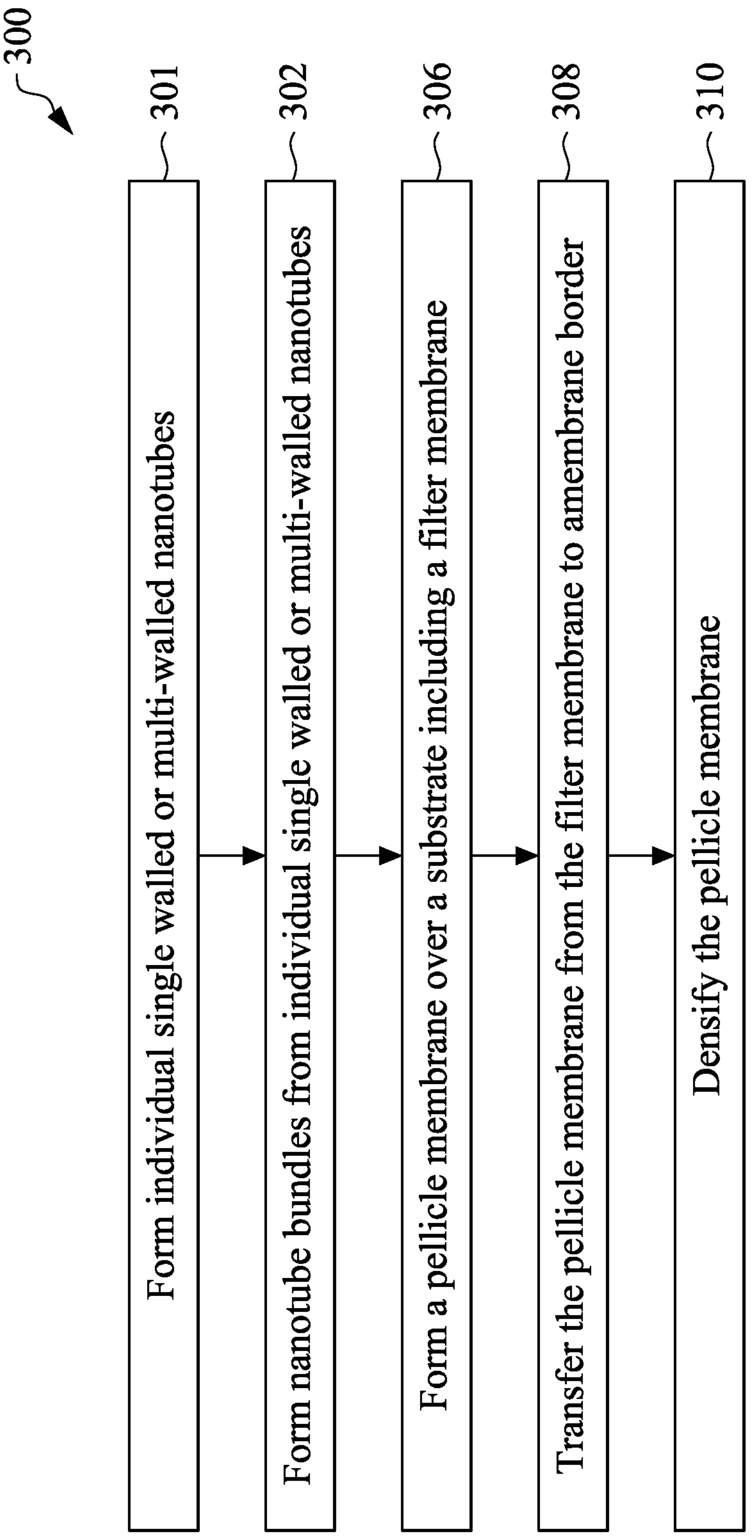
FIG. 3 is a flowchart of a method for fabricating a pellicle membrane assembly, in accordance with some embodiments.

FIG. 3 is a flowchart of a method 300 for fabricating a pellicle membrane assembly 230 using a reactor 410 for forming bundled nanotubes, in accordance with some embodiments of the present disclosure. FIGS. 4A-4E illustrate the pellicle membrane assembly 230 of FIG. 2A at various stages of the method 300. It is understood that additional steps can be provided before, during, and after the method 300, and some of the steps described below can be replaced or eliminated, for additional embodiments of the method. It is further understood that additional features can be added in the pellicle membrane assembly, and some of the features described below can be replaced or eliminated, for additional embodiments of the pellicle membrane assembly. Method 300 is also illustrative of methods carried out in reactors 510, 610, 710, 810, 910 and 1010 described below in more detail.

Figure 4A:
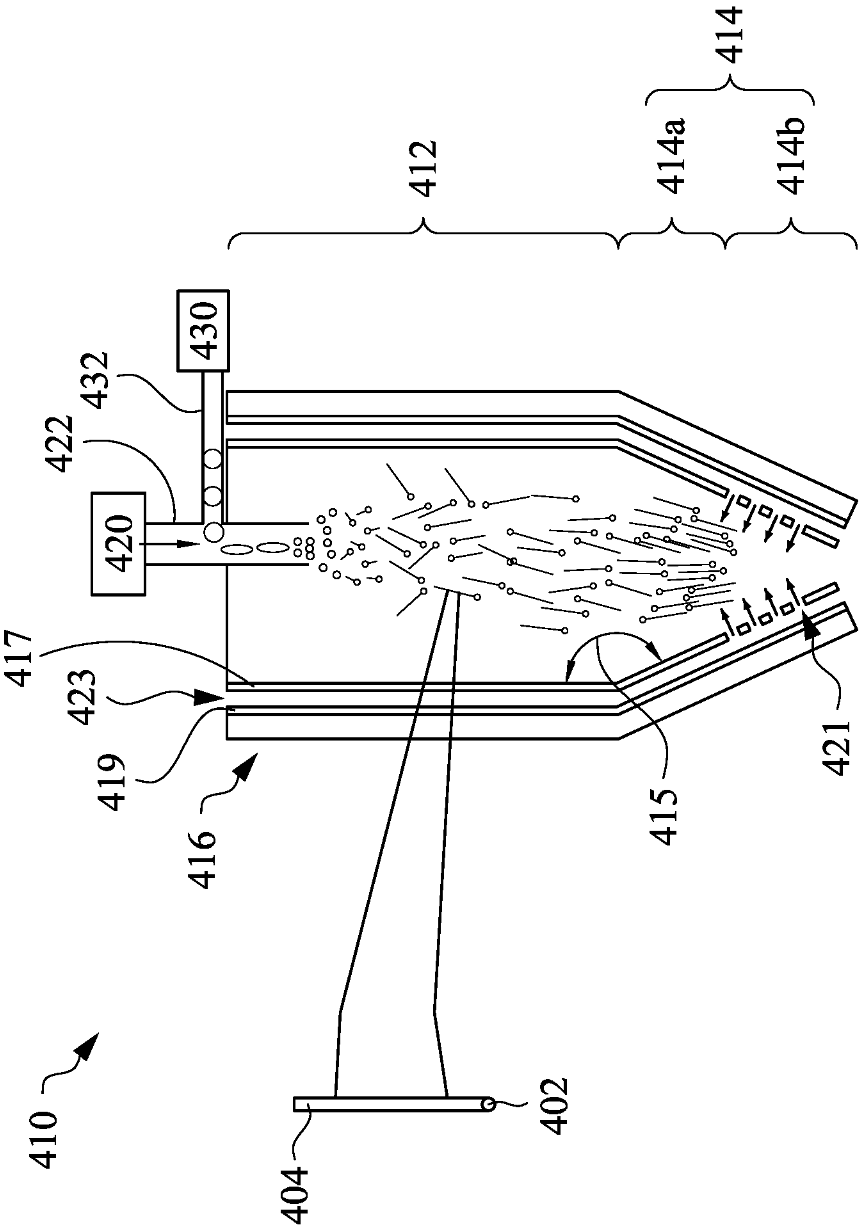
FIGS. 4A-4F illustrate nanotube bundle formation and pellicle membrane assembly therefrom at various stages of the method of FIG. 3 using a reactor in accordance with embodiments of the present disclosure.

Referring to FIGS. 3 and 4A, the method 300 includes operation 301, in which CNTs 404 are formed in a first reaction zone 412 of a reactor 410, in accordance with some embodiments. The reactor 410 is configured to form the individual single walled nanotubes 251 and the single multi-walled nanotubes 254 that constitute the nanotube bundles 250, 250', 252, 252' in a continuous process. FIG. 4A is a schematic view of the reactor 410 illustrating growth of CNTs 404 in the first reaction zone 412 of the reactor 410 by a gas-phase flow method, in accordance with some embodiments.

In operation 301, nanotubes, e.g., CNTs 404, are synthesized, for example, by a catalytic chemical vapor deposition (CVD) process in which pyrolysis of a carbon source occurs on in-situ formed metal catalyst particles 402. As illustrated in FIG. 4A, in one embodiment of the present disclosure, the reactor 410 includes a first reaction zone 412 and a second zone 414 situated downstream from the first reaction zone 412. Second zone 414 includes an upper portion **414*a* and a lower portion 414*b*. Formation of CNTs 404 is initiated in the first reaction zone 412. In some embodiments, the formation of CNTs 404 may continue in upper portion 414*a* of second zone 414, while as described in more detail below, bundling of individual CNTs 404 formed in first reaction zone 412 and upper portion 414*a* of second zone 414 is promoted in lower portion 414*b* of second zone 414. In some embodiments, reactor 410 has a total length or height, as illustrated in FIG. 4A, ranging from 2 m to 6 m. Embodiments in accordance with the present disclosure are not limited to reactor 410 having a length or height ranging from 2 m to 6 m. For example, in other embodiments, reactor 410 has a length or height that is less than 2 m or greater than 6 m. While the embodiment of FIG. 4A shows the reactor 410 in vertical orientation, in other embodiments, the reactor 410** could be oriented horizontally.

In the embodiments illustrated with reference to FIG. 4A, the first reaction zone 412 has a length ranging from 1.2 m to 5.2 m. Embodiments in accordance with the present disclosure are not limited to first reaction zone 412 having a length within the foregoing range. For example, first reaction zone 412 can have a length that is less than 1.2 m or greater than 5.2 m. In accordance with some embodiments, first reaction zone 412 of reactor 410 is cylindrical in shape with a round cross-section having an inner diameter ranging between 10 cm to 1000 cm or 0.1 m to 10 m. In other embodiments, reactor 410 has an inner diameter ranging between 10 cm to 100 cm. Embodiments in accordance with the present disclosure are not limited to reactors 410 that are cylindrical in shape, for example, in other embodiments, reactor 410 can have a cross-section (in a plane perpendicular to the direction the CNTs pass through reactor 410) that is not round or oval. For example, reactor 410 can have a cross-section that is polygonal in shape. Embodiments in accordance with the present disclosure are not limited to first reaction zone 412 having an inner diameter ranging between 10 cm to 100 cm. For example, in other embodiments, first reaction zone has an inner diameter that is less than 10 cm or greater than 100 cm. Embodiments illustrated in FIG. 4A exhibit a ratio of the length of first reaction zone 412 to the diameter of the first reaction zone 412 that is between 1:2 and 52:1. Embodiments in accordance with the present disclosure are not limited to reactors 410 that have a ratio of the length of first reaction zone 412 to the diameter of the first reaction zone 412 that falls within the foregoing range. For example, in other embodiments, reactor 410 has a ratio of the length of the first reaction zone 412 to the diameter of the first reaction zone 412 that is greater than 52:1 or less than 1:2.

The reactor of FIG. 4A includes a second zone 414 below first reaction zone 412. Second zone 414 differs in shape compared to first reaction zone 412. For example, in the embodiment of FIG. 4A, second zone 414 has a conical shape with a decreasing diameter in the direction of flow of the CNTs 404 through reactor 410. In the embodiments illustrated with reference to FIG. 4A, the second zone 414 has a length ranging from 0.8 m to 2.0 m. Embodiments in accordance with the present disclosure are not limited to second zone 414 having a length within the foregoing range. For example, second zone 414 can have a length that is less than 0.8 m or greater than 2.0 m. In accordance with embodiments illustrated in FIG. 4A, second zone 414 of reactor 410 is conical in shape and has a cross-section (in a plane perpendicular to the direction the CNTs flow through reactor 410) that is of the same shape as the cross-section of first reaction zone 412. For example, if first reaction zone 412 has a round cross-section, then second zone 414 has a round cross-section. If first reaction zone 412 has an oval cross-section, then second zone 414 has an oval cross section. Second zone 414 has an upper end connected to or in fluid communication with a bottom of first reaction zone 412 and a lower end defining an open bottom of reactor 410. The upper end of second zone 414 has inner dimensions, e.g., an inner diameter, equal to and congruent with inner dimensions of the bottom of first reaction zone 412. In the embodiment of FIG. 4A, the lower end of second zone 414 has an inner dimension, e.g., an inner diameter, equal to or greater than the width of the photomask 108 described above with reference to FIG. 1 and described below in more detail with reference to FIG. 4C. In some embodiments, lower end of second zone 414 has in inner diameter ranging between 2 cm to 100 cm. Embodiments in accordance with the present disclosure are not limited to a second zone 414 that includes a lower end having an inner diameter within the foregoing range. For example, in other embodiments, the lower end of second zone 414 has an inner diameter less than 2 cm or greater than 100 cm. Embodiments illustrated in FIG. 4A exhibit a ratio of the length of second zone 414 to the diameter of the upper end of second zone 414 that is between 0.8:1 and 20:1. Embodiments in accordance with the present disclosure are not limited to reactors 410 that have a ratio of the length of second zone 414 to the diameter of the upper end of second zone 414 that falls within the foregoing range. For example, in other embodiments, reactor 410 has a ratio of the length of the second zone 414 to the diameter of the upper end of second zone 414 that is less than 0.8:1 or greater than 20:1. Embodiments illustrated in FIG. 4A exhibit a ratio of the length of second zone 414 to the diameter of the lower end of second zone 414 that is between 0.8:1 and 100:1. Embodiments in accordance with the present disclosure are not limited to reactors 410 that have a ratio of the length of second zone 414 to the diameter of the lower end of second zone 414 that falls within the foregoing range. For example, in other embodiments, reactor 410 has a ratio of the length of the second zone 414 to the diameter of the lower end of second zone 414 that is less than 0.8:1 or greater than 100:1.

As illustrated in the embodiment of FIG. 4A, second zone 414 of reactor 410 includes a conical shape. The conical shape includes a cone angle 415. Cone angle 415 is defined between the vertical inner wall of first reaction zone 412 and the inclined inner wall of second zone 414. In some embodiments of the present disclosure, cone angle 415 ranges from greater than 90° to less than 180°. In the embodiment illustrated in FIG. 4, a lower threshold for cone angle 415 is an angle which avoids the accumulation of CNTs on the sidewall of second zone 414. In the embodiment illustrated in FIG. 4, an upper threshold for cone angle 414 is an angle that provides a desired degree of taper to second zone 414. In some embodiments, cone angle 414 ranges from 100° to 150°. Embodiments in accordance with the present disclosure are not limited to cone angle 415 being between 100° to 150°. For example, in other embodiments, cone angle 415 is less than 1000 or greater than 150°.

In some embodiments, the reactor 410 includes an inner quartz tube or liner 417 which defines an interior boundary of the first reaction zone 412 and the second zone 414 of reactor 410 and can be mounted vertically inside a heating element 416 adapted for providing thermal energy to both the first reaction zone 412 and the second zone 414 of the reactor 410. In some embodiments, the heating element 416 is a two-zone heating element configured to provide thermal energy to reactor 410 to maintain a first temperature in the first reaction zone 412, a second temperature in the second zone 414 of the reactor 410 and/or a temperature gradient within either the first reaction zone 412 or the second zone 414. In some embodiments, the heating element 416 is configured to maintain a temperature gradient from about 300° C. to about 1100° C. in the first reaction zone 412 and maintain a temperature ranging from about room temperature to about 1100° C. in the second zone 414 of the reactor 410. In some embodiments, the temperature at the opening in the bottom of reactor 410 is at or near room temperature, e.g., 20 to 22° C. In the embodiment of FIG. 4A, a partition structure 419 is positioned between the inner liner 417 and heating element 416. Partition structure 419 can be mounted to heating element 416. An inner wall of partition structure 419 is spaced apart from an exterior wall of quartz liner 417. The space between the inner wall of partition structure 419 and the exterior wall of quartz liner 417 defines a plenum which is in fluid communication with a source of nonreactive gas, e.g., nitrogen or argon. The source of nonreactive gas can also be the source of carrier gas (described below in more detail).

Figure 4B:
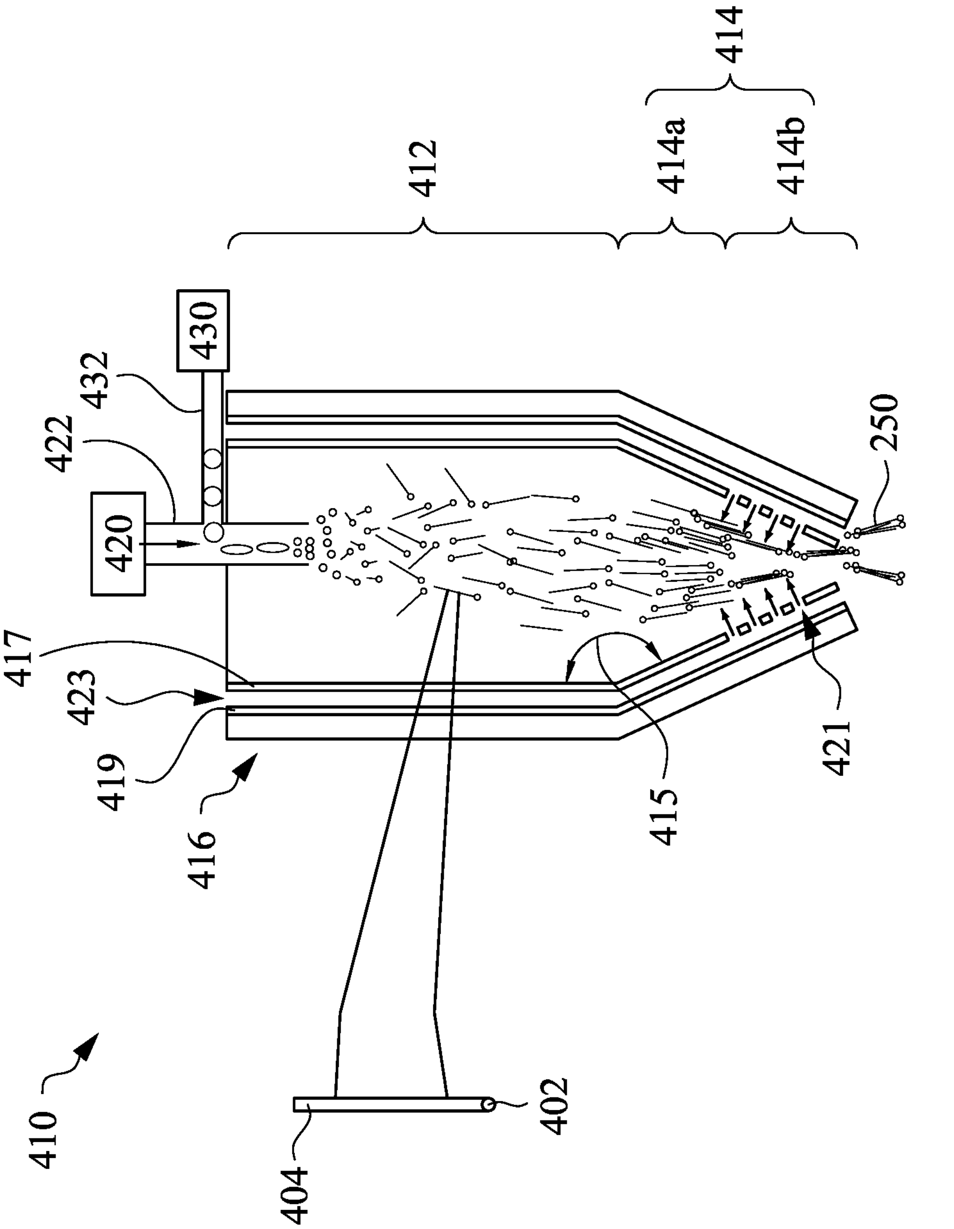
Figure 4C:
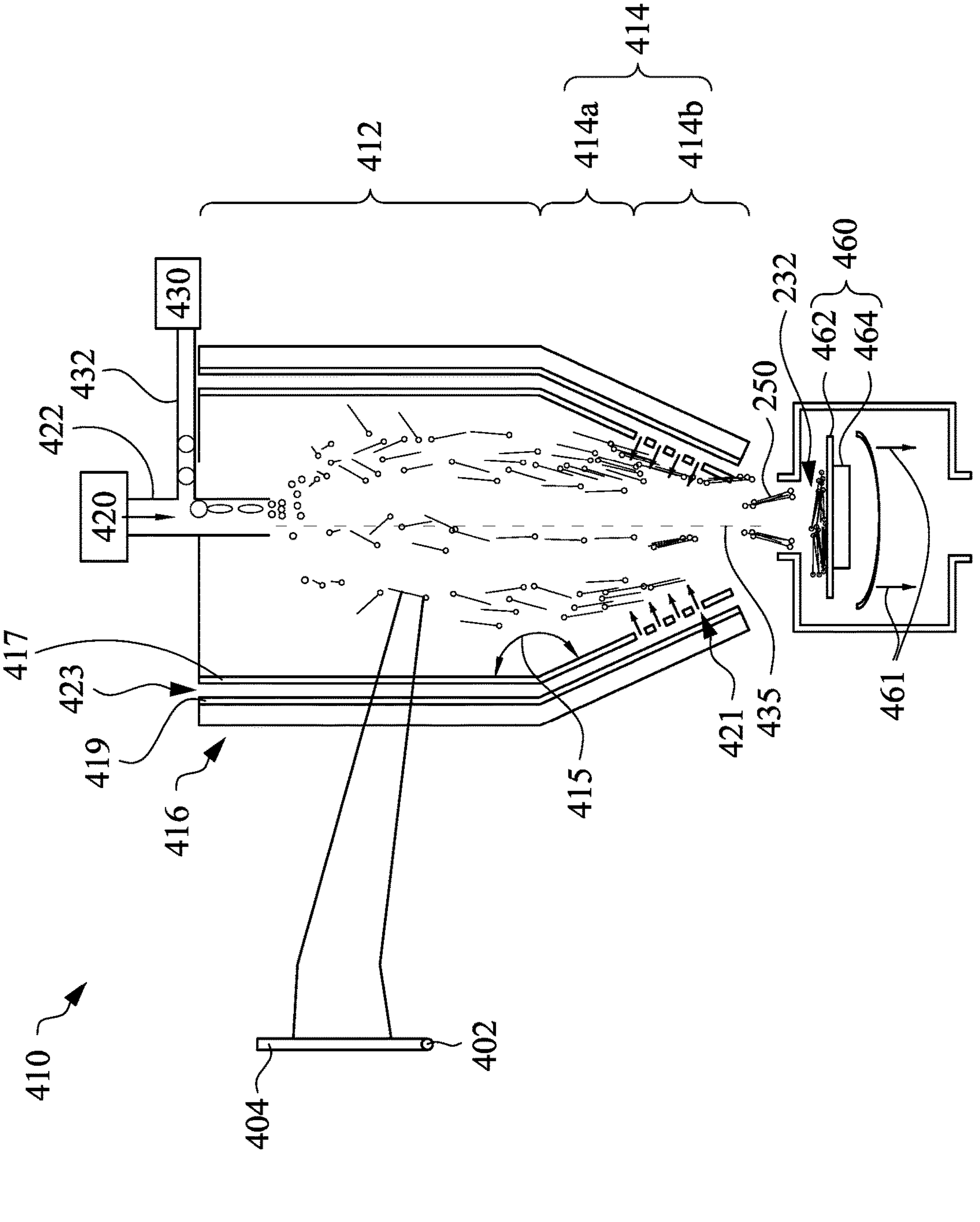
Figure 4E:
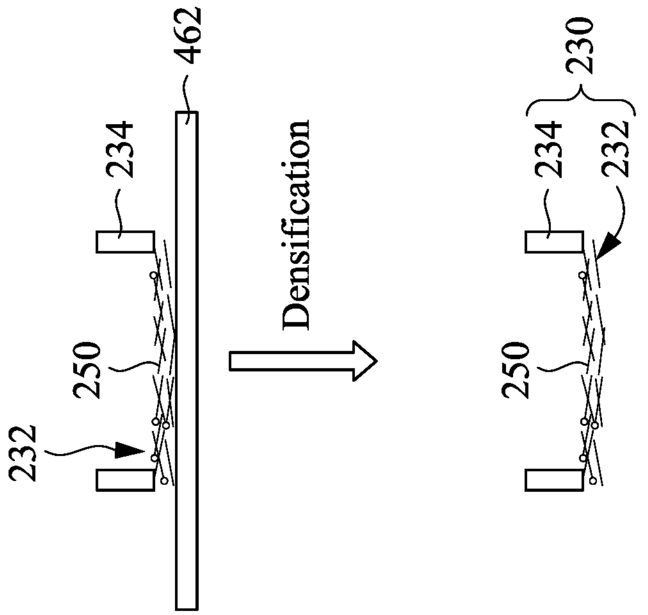
Figure 4D:
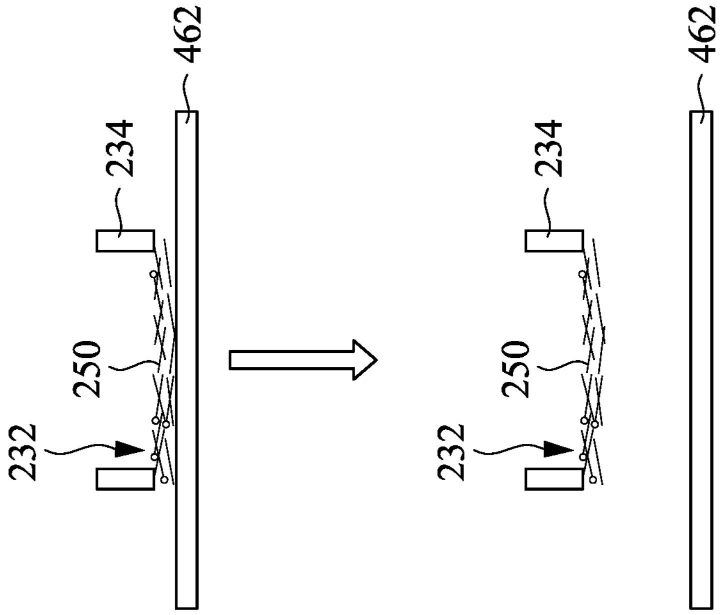
Figure 4F:
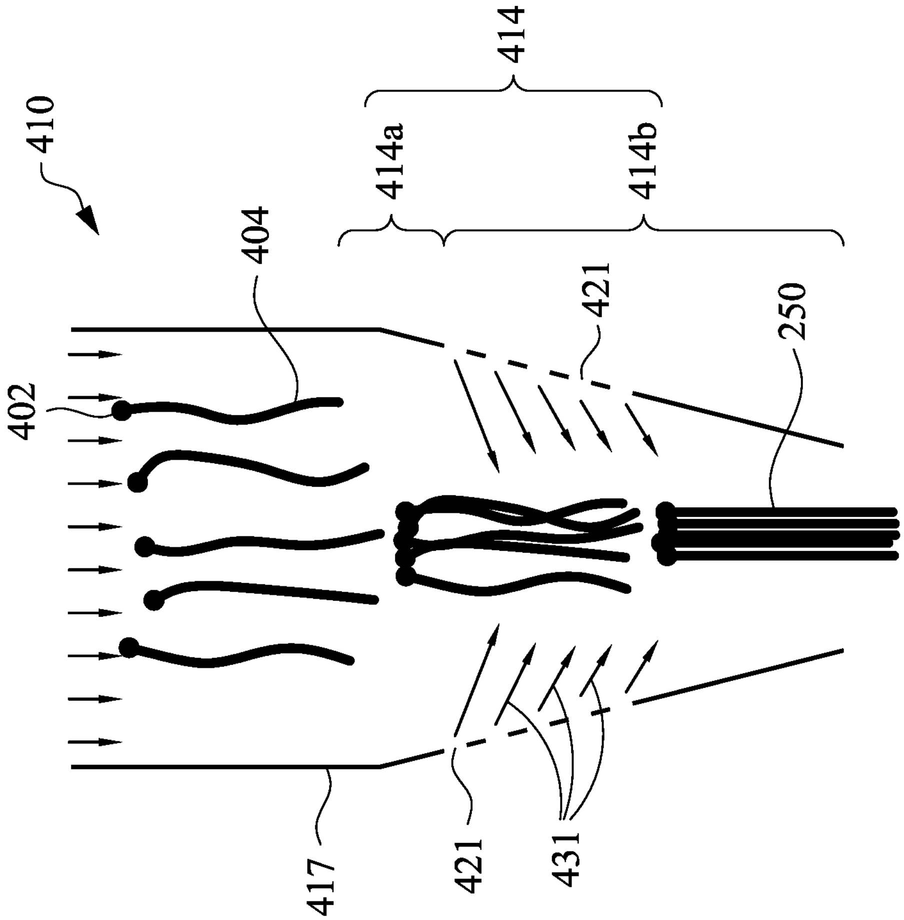
Figure 4G:
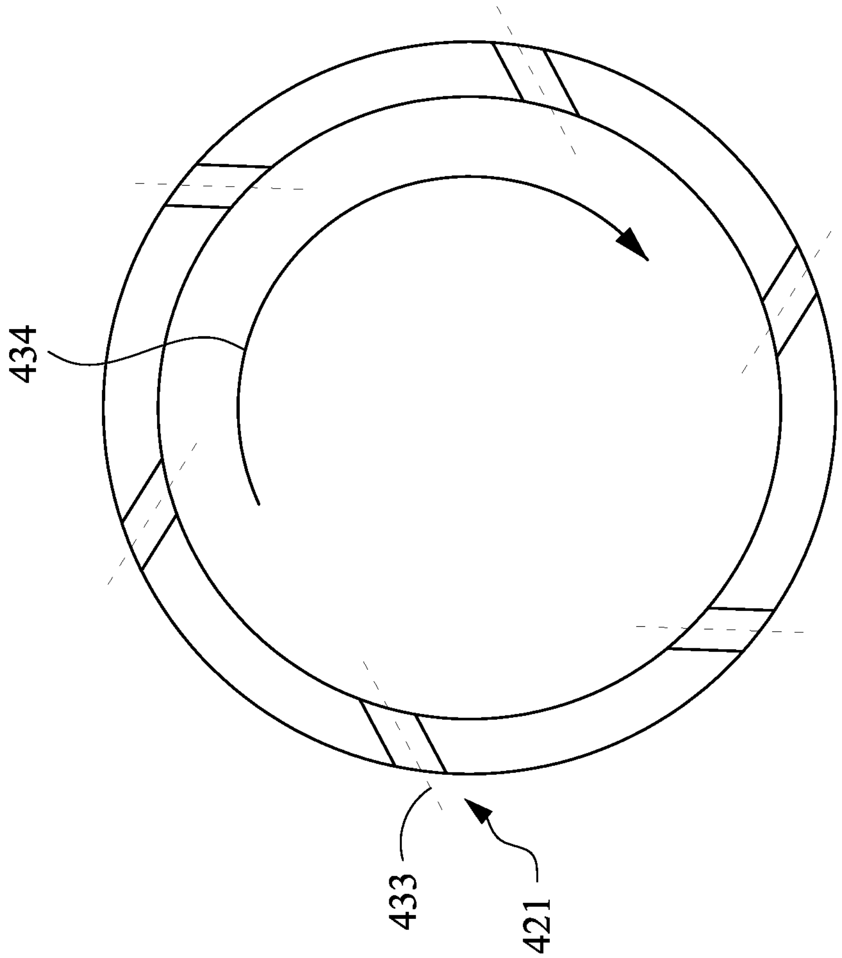
FIG. 4G illustrates an alternative embodiment of the arrangement of apertures through a liner in accordance with embodiments of the present disclosure.

Referring additionally to FIG. 4F, a portion, e.g., the lower half, of quartz liner 417 that occupies second zone 414 of reactor 410 includes a plurality of apertures 421 that pass through the quartz liner 417 and provide fluid communication between a portion of reactor 410 interior to quartz liner 417 and plenum 423 defined between the quartz liner 417 and partition structure 419. In the embodiment illustrated in FIG. 4, four apertures are illustrated; however, embodiments in accordance with the present disclosure are not limited to reactors 410 that include four apertures. Reactors in accordance with the present disclosure can include more than four apertures or less than four apertures. For example, in the embodiments of FIG. 4F, five apertures 421 are illustrated. In the embodiment illustrated in FIG. 4A, the apertures 421 include an axial centerline that is perpendicular to the interior and exterior facing surfaces of the liner 417. As such, the apertures promote the flow of inert gas into the interior of reactor 410 in a direction that is perpendicular to the interior facing surface of the liner 417. In other embodiments, the axial centerline of the apertures need not be perpendicular to the interior and exterior facing surfaces of the liner 417. For example, the axial centerline of the apertures 421 form acute or obtuse angles with the interior facing surface of the liner 417. In such embodiments, the apertures promote the flow of inert gas into the interior of reactor 410 in a direction that is not perpendicular to the interior facing surface of the liner 417 as illustrated by the arrows 431 in FIG. 4F. The foregoing embodiments are also applicable to other reactors of the present disclosure, for example the reactors of FIGS. 9 and 10. In other embodiments, as illustrated in FIG. 4G, which is a top view of a lower portion 414*b* of second zone 414 of reactor 410, the axial centerline 433 of the respective apertures 421 may be angled to promote flow of the inert gas in a vortex (indicated by the arrow 434) within reactor 410. Embodiments of FIG.

Figure 9:
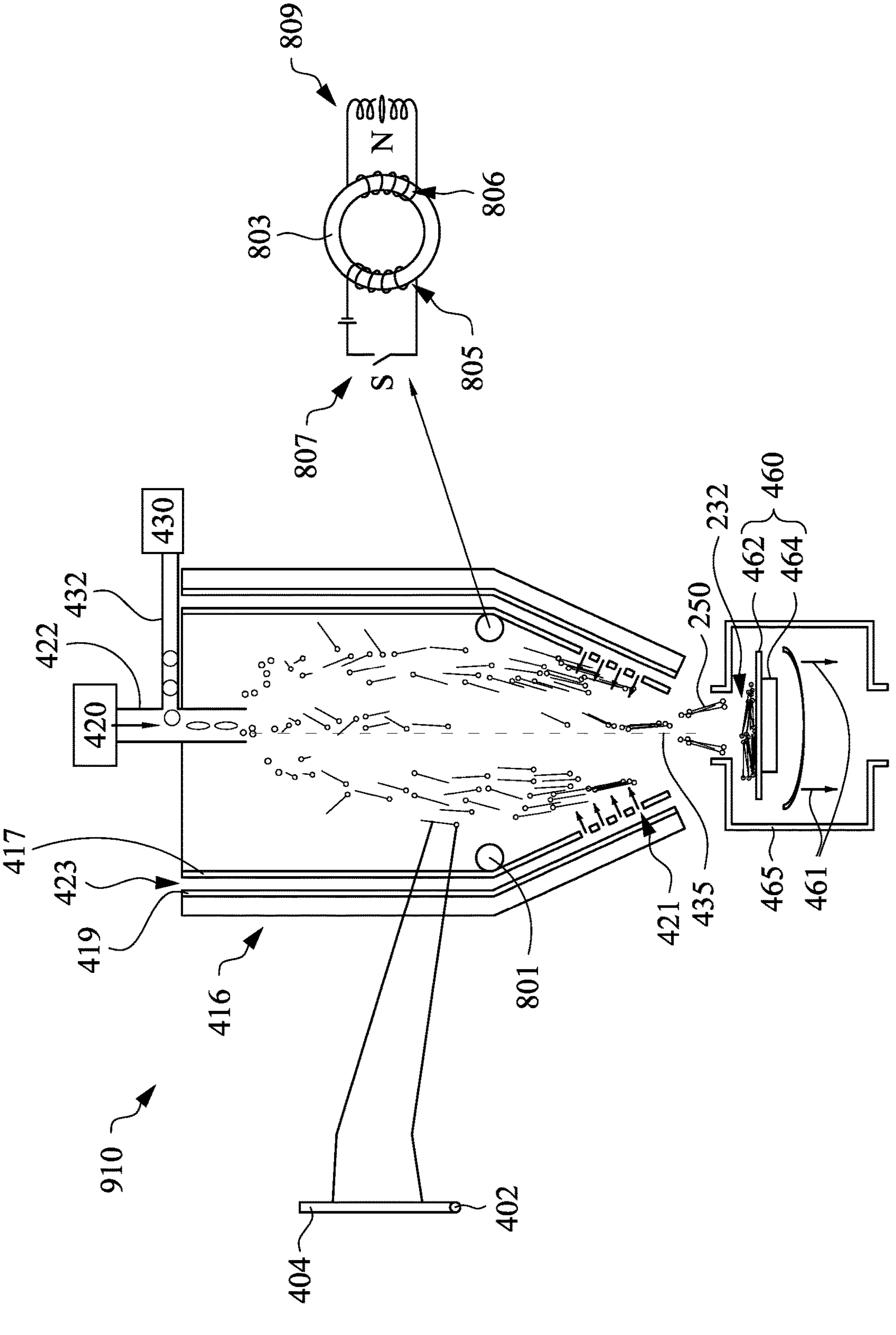
FIG. 9 illustrates nanotube bundle formation and pellicle membrane assembly therefrom at various stages of the method of FIG. 3 using a reactor in accordance with alternative embodiments of the present disclosure.
Figure 10:
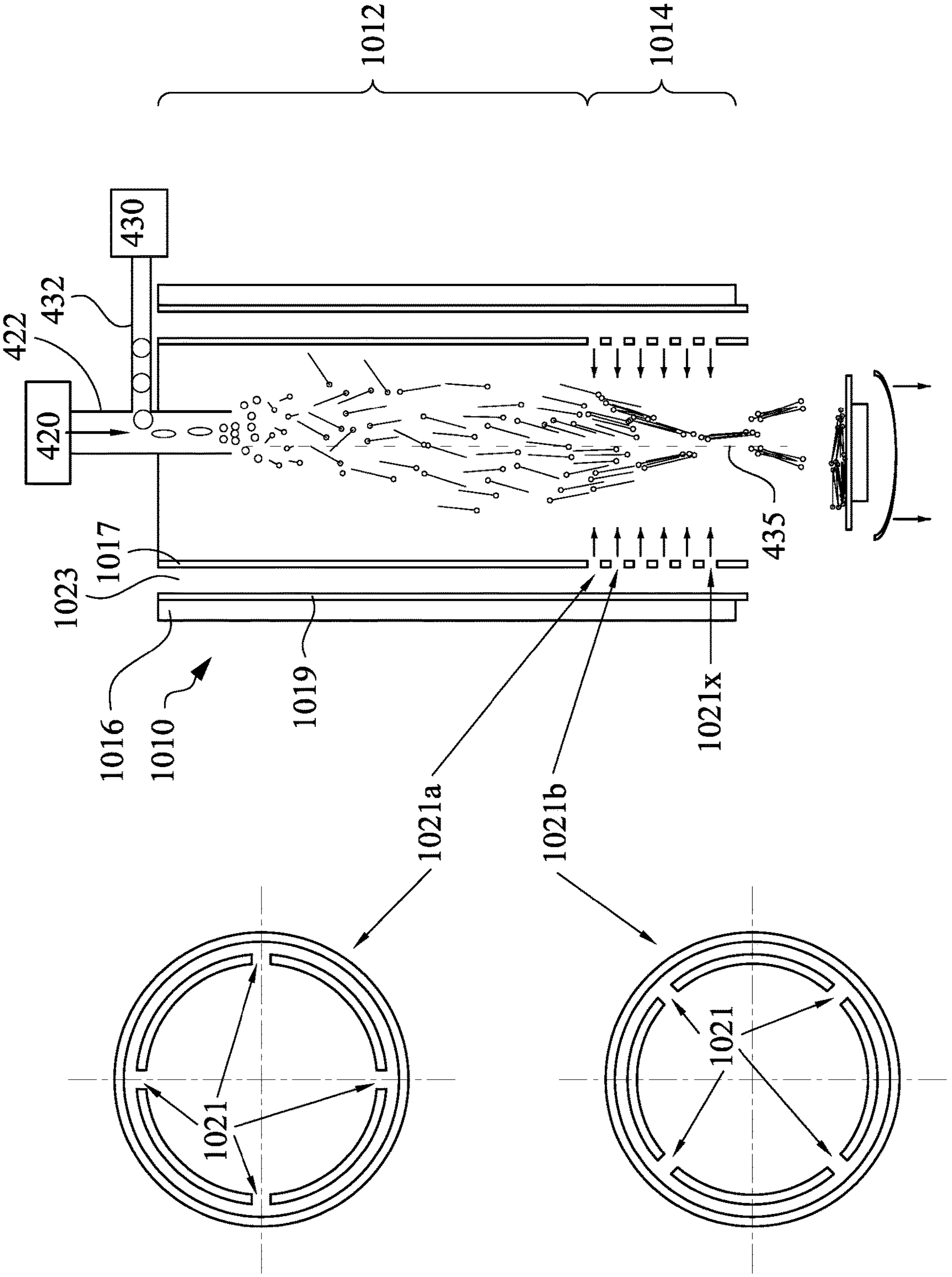
FIG. 10 illustrates nanotube bundle formation and pellicle membrane assembly therefrom at various stages of the method of FIG. 3 using a reactor in accordance with alternative embodiments of the present disclosure.

4G are also applicable to other reactors of the present disclosure, for example the reactors of FIGS. 9 and 10. In the embodiments of FIGS. 4 and 4F, the size of each aperture is chosen to provide sufficient flow of inert gas into the interior of reactor 410 to promote the movement of individual CNTs 404 and/or smaller bundles of CNTs 404 towards the vertical centerline of reactor 410, such that the individual CNTs 404 or bundles of CNTs 404 come into closer proximity to each other (compared to their proximity in reactor 410 above the apertures 421). As the individual CNTs 404 or bundles of CNTs 404 come into closer proximity to each, attractive forces between the individual CNTs 404 or bundles of CNTs 404 become more effective at drawing the individual CNTs 404 or bundles of CNTs 404 together and forming bundles or bundles of larger size, i.e., more individual CNTs. In some embodiments, each aperture defines an opening having an area in the range of 0.01 $cm^2$ to 80 $cm^2$. Embodiments in accordance with the present disclosure are not limited to apertures having an area that falls within the foregoing range. For example, in other embodiments, apertures 421 can have an area that is less than 0.01 $cm^2$ or greater than 80 $cm^2$. In some embodiments, the cross-sectional area of the apertures in the direction of flow of gas to the apertures varies from the inlet of the aperture to the outlet of the aperture. In some embodiments, the cross-sectional area of the aperture increases in the direction of gas flow through the aperture and in other embodiments, the cross-sectional area of the aperture decreases in the direction of gas flow through the aperture. The size of the opening provided by apertures 421 is chosen to provide a desired velocity for the gas flowing into the interior of reactor 410 through apertures 421. The desired velocity is a velocity which provides the desired oblique flow as described below. As the difference in pressure between the interior of reactor 410 and the pressure within plenum 423 increases, the size of the openings can be increased to provide the same gas flow velocity. In contrast, as the difference in pressure between the interior of reactor 410 and the pressure within plenum 423 decreases, the size of the openings can be decreased to provide the same gas flow velocity. In some embodiments, the area of the openings provided by the apertures 421 constitutes more than 50% of the surface area of the portion of the quartz liner 417 in which the apertures 421 are formed. Embodiments of the present disclosure are not limited to openings providing more than 50% of the surface area of the portion of the quartz liner 417 in which the apertures are formed. For example, in other embodiments, the apertures can provide openings that constitute less than 50% of the surface area of the portion of the quartz liner in which the apertures are formed. In some embodiments, the apertures 421 have a cross-section that is round or oval. In other embodiments, apertures 421 have a cross-section that is not oval or round. For example, apertures 421 can have a cross-section that is polygon.

Inert gas introduced into plenum 423 passes through quartz liner 417 through apertures 421 and into the interior of reactor 410. In accordance with the embodiments of FIG. 4A-4B, this flow of inert gas through apertures 421 impinges upon individual nanotubes that have formed in first reaction zone 412, altering the direction of flow of the individual nanotubes and/or promoting an oblique flow of the individual nanotubes. Oblique flow refers to a direction of movement of the individual nanotubes or nanotube bundles, in the second zone 414 and especially in the lower portion 414*b* of second zone 414, that is different from a direction that is substantially parallel to the axial centerline 435 of the reactor 410. Substantially parallel as used herein refers to a direction of flow that is within 0 to 10 degrees of parallel to the axial centerline 435 of the reactor 410. For example, oblique flow is neither parallel to, or perpendicular to, the interior walls of the first reaction zone 412. In some embodiments, such oblique flow is at an angle relative to the interior wall of the first reaction zone 412 that is less than the cone angle 415. One benefit of promoting such oblique flow reduces the likelihood that CNTs will accumulate on the inner liner 417 of the second zone 414. Such oblique flow and the narrowing of the diameter of second zone 414 due to its conical shape, causes the individual nanotubes and/or smaller nanotube bundles to come into closer proximity to each other, where attractive forces between individual nanotubes and/or smaller nanotube bundles, such as van der Waal forces, cause the individual nanotubes and/or smaller nanotube bundles to be attracted to each other and form, for example, medium or large bundles of nanotubes.

In FIG. 4A, a first gas supply unit 420 is fluidly connected to the first reaction zone 412 of the reactor 410 via a first gas inlet 422. The first gas supply unit 420 is configured to supply a carrier gas including an inert gas such as argon (Ar) gas or nitrogen gas and/or a reactive gas such as hydrogen ($H_2$) gas into the reactor 410. The first gas inlet 422 may include a spray nozzle for injecting the reaction mixture.

A first source material supply unit 430 is fluidly connected to the first reaction zone 412 of the reactor 410 via a first reactant inlet 432. The first source material supply unit 430 is configured to supply a feedstock for growing CNTs 404 to the first reaction zone 412. In some embodiments, the first reactant inlet 432 is connected to a side of the first gas inlet 422. The injection direction thus is in a direction perpendicular to the flow direction of the carrier gas.

In the CVD process, a feedstock comprising raw materials for growing CNTs is supplied from the first source material supply unit 430 to the first reaction zone 412 of the reactor 410 via the first reactant inlet 432. In some embodiments, the feedstock includes a carbon source. Examples of carbon sources may include, but are not limited to, gaseous carbon sources such as methane, ethane, propane, ethylene, acetylene as well as liquid volatile carbon sources such as benzene, toluene, xylene, trimethylbenzene, methanol, ethanol, and/or octanol. Alternatively, carbon monoxide gas or carbon dioxide gas can be used as a carbon source. In some embodiments, the carbon source is introduced into the reactor 410 at a flow rate up to about 800 to 900 standard cubic centimeters per minute (sccm). In some embodiments, the carbon source is introduced into the reactor 410 at flow rates approaching 0 sccm.

The feedstock further includes a catalyst precursor from which the metal catalyst particles 402 can be generated for subsequent growth of CNTs 404. Examples of catalyst precursors may include, but are not limited to, transition metals such as tungsten, molybdenum, chromium, iron, nickel, cobalt, rhodium, ruthenium, palladium, osmium, iridium, or platinum, and organometallic complexes such as ferrocene, cobaltocene, nickelocene, iron carbonyl, iron acetylacetonate, or iron oleate. The catalyst precursor can be a transition metal carbonyl complexes (such as $M(CO)_5)L$ where M=Cr, Mo or W). The feedstock may include the catalyst precursor in an amount of 0.5 to 5 wt. %, 1 to 5 wt. %, or 1.5 to 4 wt. % based on the amount of the carbon source. In accordance with some embodiments, the flow rate of catalyst into reactor 410 is from 0 to 1 sccm. Embodiments in accordance with the present disclosure are not limited to the foregoing flow rates for catalyst. For example, in other embodiments, the flow rate of catalyst into reactor 410 is greater than 1 sccm. If an excess amount of the catalyst precursor is used relative to the amount of the carbon source, the catalyst may act as an impurity, making it difficult to obtain highly pure CNTs.

In some embodiments, the feedstock may further include a catalyst promoter. The catalyst promoter contains sulfur atoms which interact with metal catalyst particles 402, thereby promoting formation of single-walled CNTs. Examples of a catalyst promoter may include, but are not limited to, thiophene, thianaphthene, benzothiophene, and hydrogen sulfide. The feedstock may include the catalyst promoter in an amount of 0.5 to 5 wt. %, 1 to 5 wt. %, or 1.5 to 4 wt. % based on the amount of the carbon source. In accordance with some embodiments, the flow rate of catalyst promoter into reactor 410 is from 0 to 1 sccm. Embodiments in accordance with the present disclosure are not limited to the foregoing flow rates for catalyst promoter. For example, in other embodiments, the flow rate of catalyst promoter into reactor 410 is greater than 1 sccm. If an excess amount of the catalyst promoter is used relative to the amount of the carbon source, the catalyst promoter may act as an impurity, making it difficult to obtain highly pure CNTs.

In some embodiments, the feedstock includes methane as the carbon source, ferrocence ($Fe(C_5H_5)_2$ as the catalyst precursor, and thiophene as the catalyst promoter.

The feedstock may be transported into the reactor 410 by a carrier gas to ensure a rapid homogeneous reaction. In some embodiments, the carrier gas may include an inert gas such as argon (Ar) or helium (He) gas and/or a reactive gas such as hydrogen ($H_2$) gas. In some embodiments, the carrier gas is introduced into the reactor 410 at a flow rate ranging from approaching 0 to 60,000 sccm depending on the composition of the carrier gas. For example, when the carrier gas is argon, the flow rate is up to 50,000 sccm. When the carrier gas is nitrogen, the flow rate can be up to 60,000 sccm. When the carrier gas is hydrogen, the flow rate can be up to 1000 sccm and when the carrier gas is oxygen, the flow rate can be up to 1 sccm. Embodiments in accordance with the present disclosure are not limited to the foregoing ranges of carrier gas. For example, in other embodiments, the flow rates of carrier gas can be greater than those set forth above. In some embodiments, a ratio of the carbon source to the carrier gas, which is a volume ratio of the carbon source to the carrier gas, at room temperature is from $5.0\times10^{-8}$ to $1.0\times10^{-4}$ v/v or from $1.0\times10^{-7}$ to $1.0\times10^{-5}$ v/v.

In some embodiments, the feedstock may be preheated prior to, or in combination with its introduction into the first reaction zone 412 of the reactor 410 to vaporize the reactants in the feedstock. In some embodiments, before entering the first reaction zone 412 of the reactor 410, the feedstock is maintained at a temperature below the decomposition temperature of the catalyst precursor. If the temperature exceeds the decomposition temperature of the catalyst precursor, catalyst clusters may form too early in the process and become inactivated before they can participate in the CNT growth process. In some embodiments, the feedstock is maintained at a temperature from 70° C. to 200° C.

In some embodiments, the reactor 410 is heated to produce a temperature gradient in the first reaction zone 412. In some embodiments, the temperature gradient is produced from about 300° C. to about 1100° C. with a temperature increase along the length of the first reaction zone 412. Thus, once the feedstock is injected into the first reaction zone 412 of the reactor 410 via the first gas inlet 422, the catalyst precursor decomposes to form metal catalyst particles 402. In some embodiments, the metal catalyst particles 402 may be formed to have a diameter ranging from about 0.5 nm to about 5 nm. As the carbon source contacts the metal catalyst particles 402 in the first reaction zone 412, the carbon source is decomposed at high temperatures (e.g., at about 700° C. or greater) on metal catalyst particles 402 and the CNTs 404 are grown from the metal catalyst particles 402 in such a way that a metal catalyst particle 402 is embedded in the growth tip of a CNT 404. The diameter of the CNTs 404 is thus determined by the size of the metal catalyst particles 402. Each of CNTs 404 formed may include an individual single-walled CNT or an individual double or multi-walled CNT.

Referring to FIGS. 3 and 4B, the method 300 proceeds to operation 302, in which bundling of the individual single walled or individual multi-walled CNTs formed in first reaction zone 412 is promoted in at least the lower portion 414*b* of second zone 414 as described above with reference to FIG. 4A. Accordingly, a plurality of individual bundled nanotube structures 250 are formed. The discussion below of embodiments of FIG. 4C-4E, is presented with reference to medium single walled nanotube bundles 250, but is equally applicable to nanotube bundles 250', 252 or 252' described above with reference to FIGS. 2D, 2E and 2F. Each of the individual bundled nanotube structures includes a plurality of nanotubes, e.g., CNTs 404. As noted above, the bundles may be a bundle of single walled CNTs 404 or a bundle of multi-walled CNTs 404 including 2 to 20 or more individual CNTs.

The high temperature (i.e., temperature from 1000° C. to about 1100° C.) used to form the individual CNTs 404 as described above causes evaporation of the metal catalyst nanoparticles 402 at the tips of the CNTs 404, which in turn results in removal of the metal catalyst from the CNTs 404. Thus, after exiting the reactor 410, the bundled nanotube structures 250, 250', 252 or 252' contain less than 0.01 atomic % of catalyst metal. In some embodiments, the catalyst metal is completely removed so that the bundled nanotube nanotubes are free of catalyst metal. Since catalyst metal has a higher absorption coefficient in the EUV wavelengths than carbon (and boron nitride if present), simultaneous removal of the catalyst metal during the growth of the CNT bundles helps to improve the EUV transmission of the pellicle membrane 232.

Referring to FIGS. 3 and 4C, the method 300 proceeds to operation 306, in which a pellicle membrane 232 is formed over a substrate 460, in accordance with some embodiments. FIG. 4C is a schematic view of the reactor 410 illustrating the bundled nanotubes 250 exiting the reactor 410, thereby forming the pellicle membrane 232 over the substrate 460, in accordance with some embodiments.

The bundled nanotubes 250 are collected at the bottom of the reactor 410 by substrate 460 contained in a chamber 465 which is in fluid communication with vacuum source for applying a vacuum suction process described below in more detail. In some embodiments, the substrate 460 may include a filter membrane 462. In some embodiments, the filter membrane 462 is a porous membrane having pores between about 0.1 μm to about 5 μm in diameter. In one example, the pore size in the filter membrane 462 is from about 0.1 μm to about 0.6 μm. In another example, the pore size is about 0.45 μm. In some embodiments, the filter membrane 462 is formed of or coated with polyethylene terephthalate (PET). In some embodiments, the filter membrane 462 is formed of or coated with other suitable materials such as nylon, cellulous, polymethylmethacrylate (PMMA), polystyrene (PS), polytetrafluoroethylene (PTFE), or polybenzoxazole (PBO). In some embodiments, the filter membrane 462 is formed of a cellulose-based filter paper. In some embodiments, the filter membrane 462 is a hydrophilic membrane. In some other embodiments, the filter membrane 462 is a hydrophobic membrane.

In some embodiments, to prevent the penetration of the bundled nanotubes 250 through the pores of the filter membrane 462, the substrate 460 may further include a support 464 over which the filter membrane 462 is placed. The support 464 may be formed of any suitable material, such as glass or quartz. In some embodiments, the support 464 is formed of a quartz substrate. The support 464 may be connected to a rotatable drive. Activation of the rotatable drive causes the support to rotation, e.g., rotate at 0-500 rpm. Such rotation promotes the random orientation of the bundled nanotubes that are deposited on support 464.

A vacuum suction process represented by arrows 461 may be applied to the substrate 460 within chamber 465 to facilitate the uniform dispersion of the bundled nanotubes 250 on the filter membrane 462. One or more layers of distributed nanotube bundles, in some embodiments uniformly distributed nanotube bundles, is thus formed on the filter membrane 462 to provide a pellicle membrane 232. The pellicle membrane 232 may include, for example, one, two, three, four, or more layers of nanotube bundles 250. Each layer of nanotube bundles 250 may include a random web of nanotube bundles 250.

In some embodiments, after formation of the pellicle membrane 232, the support 464 may be subsequently removed from the structure.

Referring to FIGS. 3 and 4D, the method 300 proceeds to operation 308, in which the pellicle membrane 232 is transferred from the filter membrane 462 to a membrane border 234, in accordance with some embodiments. FIG. 4D is a schematic illustration of transferring the pellicle membrane 232 from the filter membrane 462 to the membrane border 234, in accordance with some embodiments.

As illustrated in FIG. 4D, the transfer of the pellicle membrane 232 is carried out by first attaching the membrane border 234 along a peripheral portion of the pellicle membrane 232. In some embodiments, the membrane border 234 is made of silicon. To attach the membrane border 234 to the pellicle membrane 232, in some embodiments, the membrane border 234 is first brought into physical contact with the pellicle membrane 232. The membrane border 234 is then pressed against the pellicle membrane 232 to fix the membrane border 234 to the pellicle membrane 232, given that a sufficient force is used. In some embodiments, the membrane border 234 and the pellicle membrane 232 are held together by van der Waals forces. In some embodiments, before attaching the membrane border 234 to the pellicle membrane 232, the membrane border 234 is pre-wetted by a polar solvent such as ethanol. The ethanol helps to improve the adhesion between the membrane border 234 and the pellicle membrane 232 so as to provide a stable contact therebetween.

Subsequently, the filter membrane 462 is removed from the pellicle membrane 232. In some embodiments, the filter membrane 462 may be removed by peeling or pulling the filter membrane 462 away from the pellicle membrane 232. As shown in FIG. 4D, after removal of the filter membrane 462, the pellicle membrane 232 is supported by the membrane border 234 along the peripheral portion of the pellicle membrane 232.

In some embodiments, and when ethanol is employed to improve the adhesion between the pellicle membrane 232 and the membrane border 234, after removing the filter membrane 462, the assembly, including the pellicle membrane 232 and the membrane border 234, is dried in air or under vacuum for a period of time to allow the ethanol to evaporate.

Referring to FIGS. 3 and 4E, the method 300 proceeds to operation 310, in which the pellicle membrane 232 is densified, in accordance with some embodiments. FIG. 4E is a schematic illustration of densifying the pellicle membrane 232, in accordance with some embodiments.

As illustrated in FIG. 4E, in some embodiments, the nanotube bundles 250 in the pellicle membrane 232 are densified and held together by van der Waals forces. The densification may be performed by first treating the pellicle membrane 232 with an organic solvent. The organic solvent is a volatile solvent such as, ethanol, methanol, acetone, dicloroethane, chloroform, or combination thereof. In some embodiments, the pellicle membrane 232 is treated by exposing the pellicle membrane 232 to ethanol vapor. After being contacted with the organic solvent, the bundled nanotubes 250 in the pellicle membrane 232 are compacted. The densification of the nanotube bundles 250 increases the density of the pellicle membrane 232, which helps to minimize passage of particles through the pellicle membrane 232. Densification of the nanotube bundles 250 also helps to improve contact between the pellicle membrane 232 and the membrane border 234. After densification, the pellicle membrane 232 is then dried under vacuum or in air.

The pellicle membrane 232 thus formed, includes a network of densified nanotube bundles 250 as illustrated in FIG. 2B. The individual nanotube bundles 250 are arranged randomly in the pellicle membrane 232 so that the nanotube bundles 250 are not arranged along a major or predominant direction. The pellicle membrane 232 may have a thickness ranging from about 50 nm to about 100 nm. The thickness of the pellicle membrane 232 may be greater depending on the porosity of the pellicle membrane 232. In some embodiments, during the formation of the pellicle membrane 232 the membrane is processed to remove the metal catalyst nanoparticles. For example, the pellicle membrane can be exposed to temperatures sufficient to evaporate the metal catalyst nanoparticles.

Figure 5:
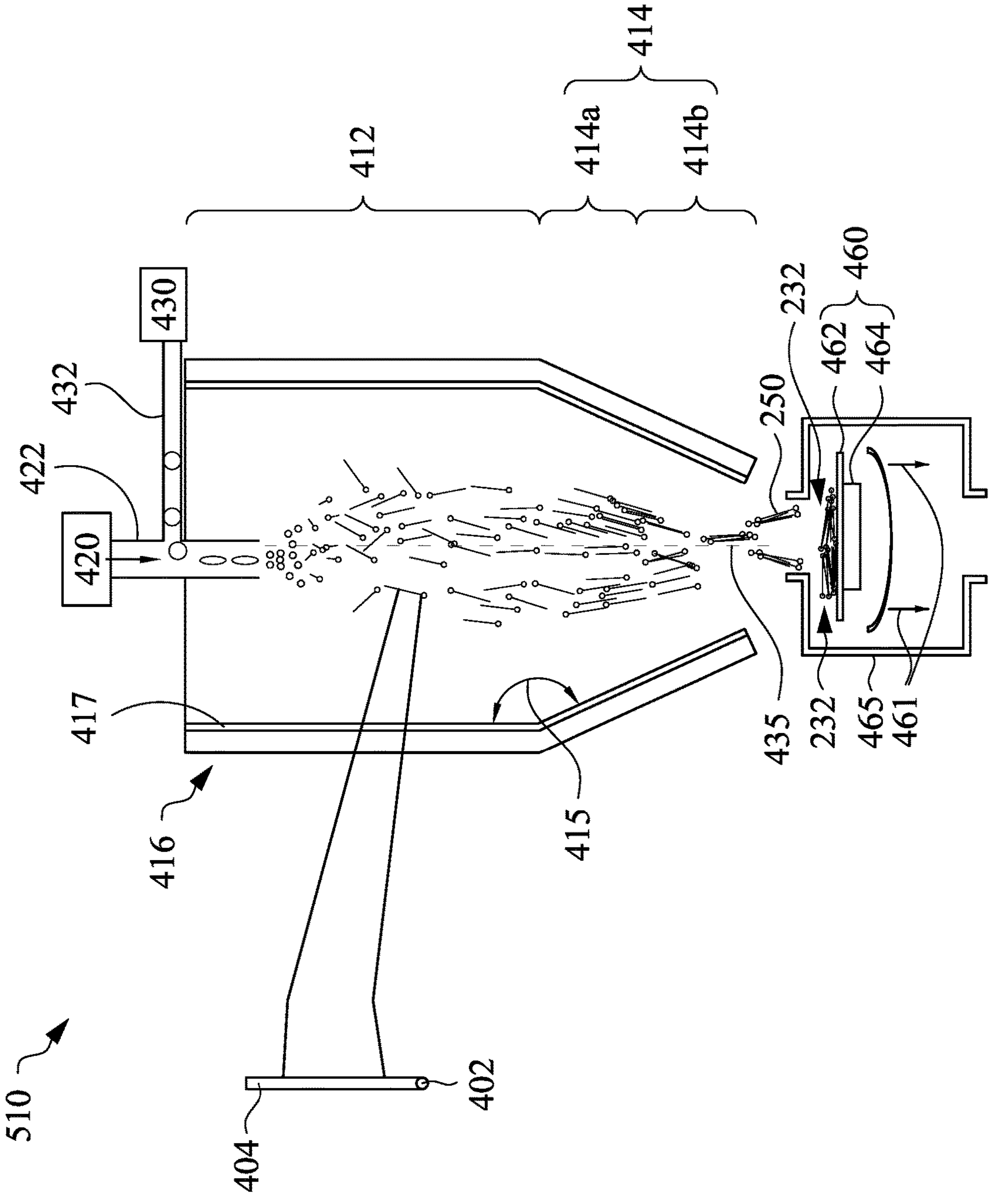
FIG. 5 illustrates nanotube bundle formation and pellicle membrane assembly therefrom at various stages of the method of FIG. 3 using a reactor in accordance with alternative embodiments of the present disclosure.

FIG. 5 illustrates an alternative embodiment in accordance with the present disclosure wherein a reactor 510 is utilized to carry out the method 300 of FIG. 3. Elements of reactor 510 which are identical to elements of reactor 410 and the pellicle formation elements in FIGS. 4A-4C are identified by the same reference numerals in FIG. 5 as the reference numbers used in FIGS. 4A-4C. Reactor 510 differs from reactor 410 in that plenum 423 is absent and apertures 421 are also absent. The description above regarding FIGS. 3 and 4A-4E is applicable to reactor 510 with the exception of the utilization of plenum 423 and apertures 421 to provide a gas flow into the interior of reactor 410 which promotes an oblique flow of the nanotubes and bundles of nanotubes in lower portion 414*b* of second zone 414. In the embodiment of FIG. 5, oblique flow of the nanotubes and bundles of nanotubes in lower portion 414*b* of second zone 414 is promoted by the conical shape of the lower portion 414*b* without the effect of flow of an inert gas through apertures 421 in FIG. 4A.

Referring additionally to FIG. 3, fabrication of a pellicle membrane assembly 230 using reactor 510 for forming bundled nanotubes, in accordance with some embodiments of the present disclosure proceeds with step 301 described above. Within reactor 510, step 302 forms nanotube bundles by promoting oblique flow of the nanotubes and bundles of nanotubes in lower portion 414*b* of second zone 414. Such oblique flow promotes the formation of nanotubes as described above. Method 300 then proceeds with step 306, 308 and 310 to form a pellicle membrane in accordance with the discussion above.

Figure 6:
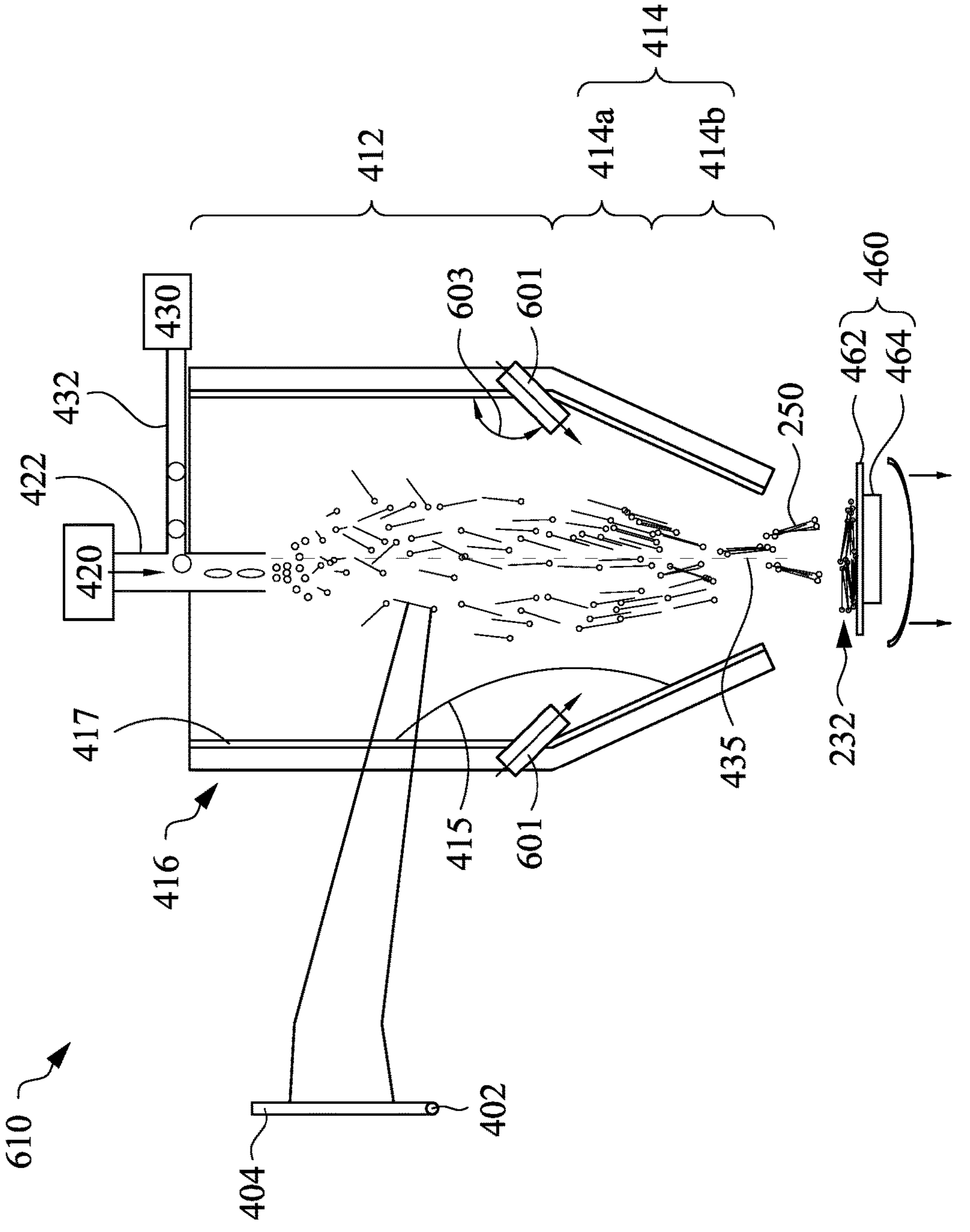
FIG. 6 illustrates nanotube bundle formation and pellicle membrane assembly therefrom at various stages of the method of FIG. 3 using a reactor in accordance with alternative embodiments of the present disclosure.

FIG. 6 illustrates an alternative embodiment in accordance with the present disclosure wherein a reactor 610 is utilized to carry out the method 300 of FIG. 3. Elements of reactor 610 which are identical to elements of reactor 410 and the pellicle formation elements in FIGS. 4A-4C are identified by the same reference numerals in FIG. 6 as the reference numbers used to identify those elements in FIGS. 4A-4C. Reactor 610 differs from reactor 410 in that plenum 423 is absent and apertures 421 are also absent. The description above regarding FIGS. 3 and 4A-4E is applicable to reactor 510 with the exception of the utilization of plenum 423 and apertures 421 to provide a gas flow into the interior of reactor 410 which promotes an oblique flow of the nanotubes and bundles of nanotubes in lower portion 414*b* of second zone 414. Reactor 610 includes nozzles 601 passing through the liner 417 which introduce inert gas (e.g., argon or nitrogen) into the second zone 414 and provide a gas flow that promotes the oblique flow of nanotubes and/or small bundles of nanotubes described above with reference to the embodiments of FIGS. 3, 4A-4E and 5. In some embodiments, the flow rate of the inert gas through nozzles 601 is in the range of 2-200 sccm. Embodiments in accordance with the present disclosure are not limited to flow rates of the inert gas in the foregoing range. For example, the flow rate of the inert gas through nozzles 601 in embodiments of FIG. 6 can be below 2 sccm or above 200 sccm. Nozzles 601 are in fluid communication with a source of inert gas (not shown) which could be first gas supply unit 420 in FIG. 4A. As with the embodiments of FIGS. 4A-4E and 5, oblique flow of the nanotubes and bundles of nanotubes in lower portion 414*b* of second zone 414 is also promoted by the conical shape of the lower portion 414. In accordance with embodiments of FIG. 6, nozzles 601 are tilted such that they direct the inert gas downward and towards the vertical centerline of reactor 610. In some embodiments, the angle 603 of the nozzles is 120° to 170° relative to the inner surface of the inert liner 417. Embodiments in accordance with the present disclosure are not limited to angle 603 being within the foregoing range. For example, angle 603 can be less than 120° or greater than 170°. In accordance with some embodiments of the present disclosure, nozzles 601 of this embodiment can be implemented in reactor 410 of FIGS. 4A-4C. In some embodiments, nozzles 601 are not directed at the axial centerline of the reactor, but instead are arranged so that the gas flow is introduced into reactor 610 at an angle that is tangential to the axial centerline. Orienting nozzles 601 and this matter promotes the creation of a vortex flow of the inert gas within reactor 610.

Referring additionally to FIG. 3, fabrication of a pellicle membrane assembly 230 using reactor 610 for forming bundled nanotubes, in accordance with some embodiments of the present disclosure proceeds with step 301 described above. Within reactor 610, step 302 forms nanotube bundles by promoting oblique flow of the nanotubes and bundles of nanotubes in lower portion 414*b* of second zone 414 utilizing the gas flow from nozzles 601 and the conical shape of second zone 414. Such oblique flow and conical shape of second zone 414 promotes formation of nanotubes as described above. Method 300 then proceeds with steps 306, 308 and 310 to form a pellicle membrane in accordance with the discussion above.

Figure 7:
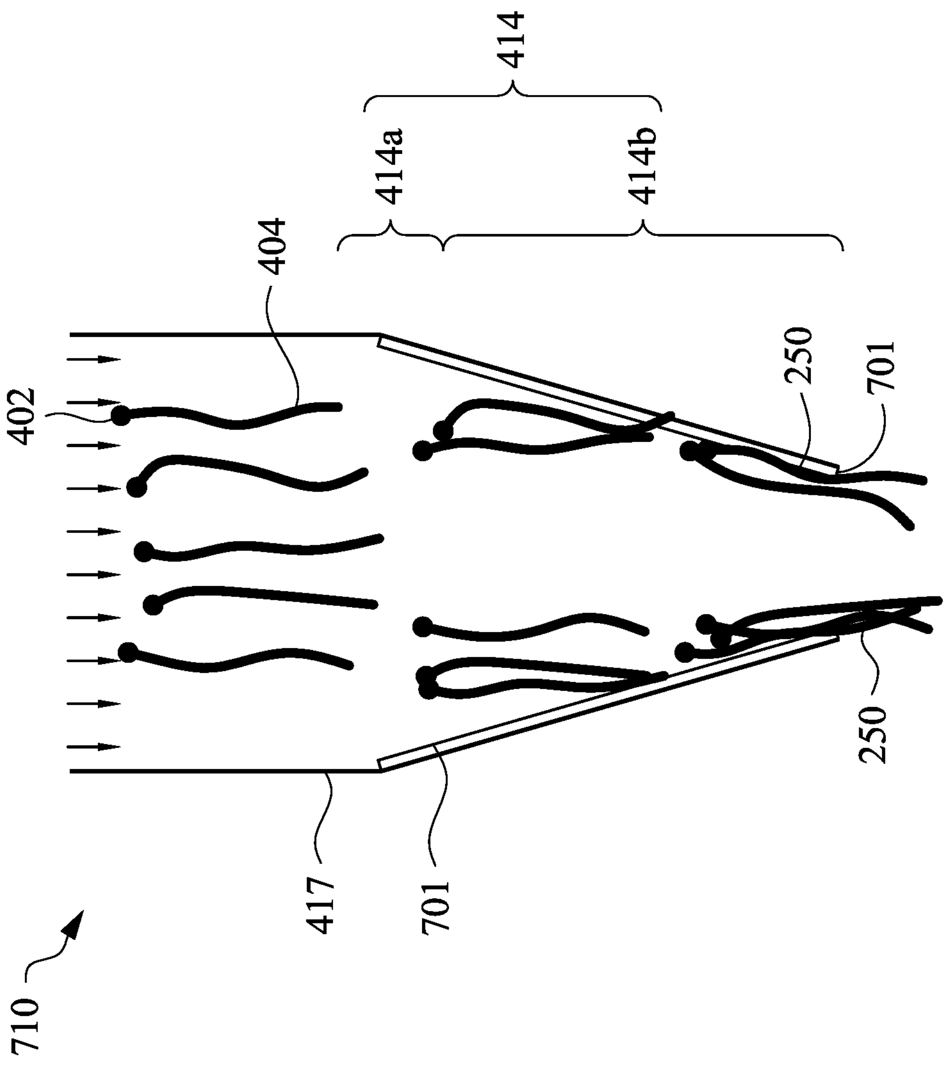
FIGS. 7 and 7A illustrate nanotube bundle formation and pellicle membrane assembly therefrom at various stages of the method of FIG. 3 using a reactor in accordance with alternative embodiments of the present disclosure.
Figure 7A:
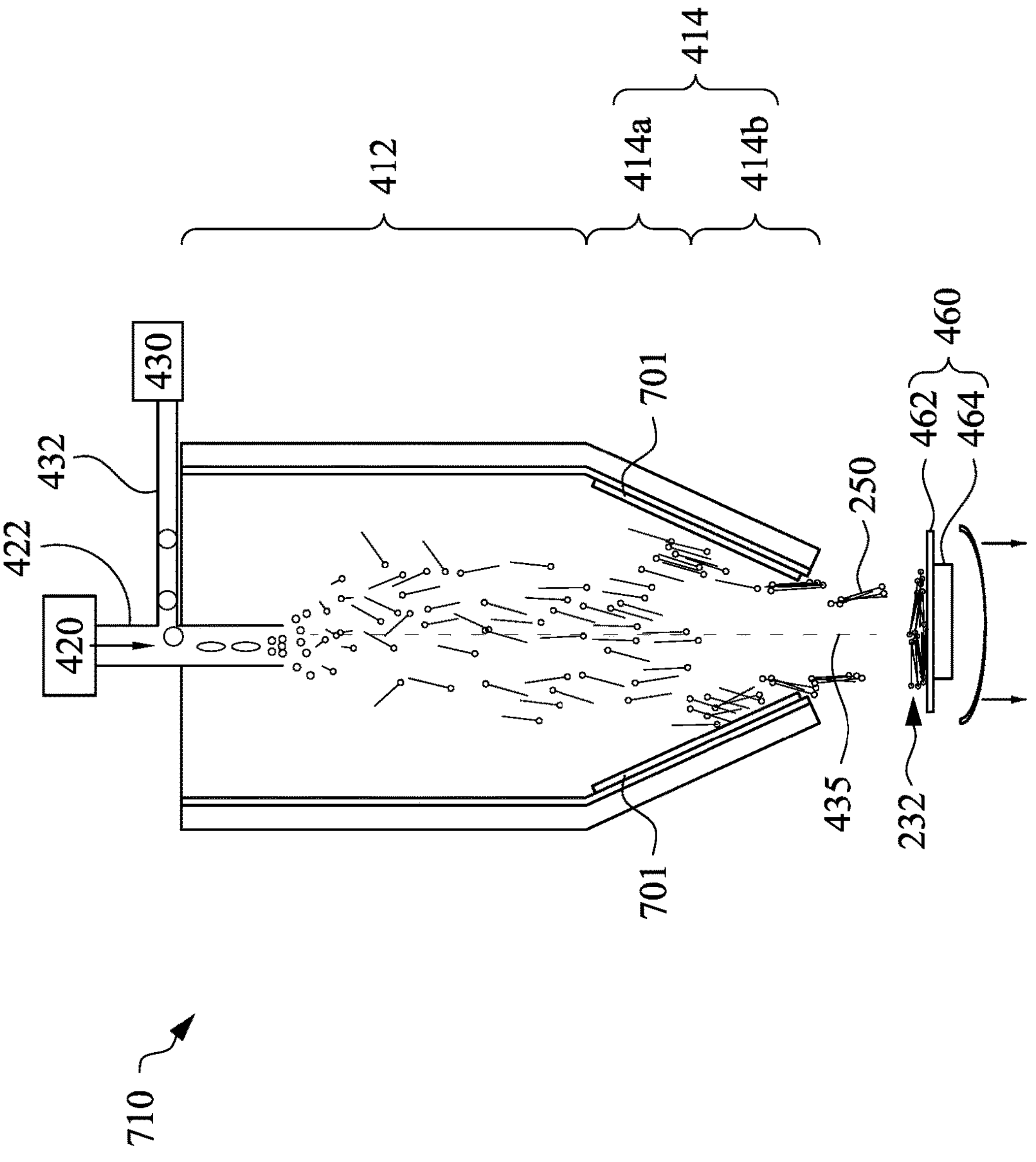

FIGS. 7 and 7A illustrate another aspect of the present disclosure. FIG. 7 is a reproduction of the reactor structure described above with reference to FIG. 4F. Elements of reactor 710 in FIG. 7 which are identical to elements of reactor 410 in FIG. 4F are identified by the same reference numerals in FIG. 7 as the reference numbers used to identify those elements in FIG. 4F. FIG. 7A is a reproduction of the reactor structure described above with reference to FIG. 5. Elements of reactor 710 in FIG. 7A which are identical to elements of reactor 510 in FIG. 5 are identified by the same reference numerals in FIG. 7A as the reference numbers used to identify those elements in FIG. 5. The embodiments of FIGS. 7 and 7A, unlike the embodiment of FIGS. 4F and 5 do not include apertures 421, and instead include an electrode 701 in the second zone 414. Electrode 701 is on or adjacent to liner 417 in second zone 414. In the embodiment of FIGS. 7 and 7A, electrode 701 is a one-piece solid electrode having a conical shape. In other embodiments, electrode 701 can comprise multiple electrodes each individually connected to a voltage source. Such multiple electrodes can be oriented as individual rings located in different horizontal planes and centered on the axial centerline 435 of the reactor or they can be arranged as individual rods oriented vertically in FIGS. 7 and 7A and parallel to the axial centerline 435 of the reactor. Electrode 701 is electrically connected to a controllable voltage source (not shown) capable of providing voltage pulses to electrode 701. In accordance with embodiments of FIGS. 7 and 7A, when a voltage pulse is applied to electrode 701 an electric field is produced. When the voltage pulse is terminated, the electric field dissipates. When the electric field is present, the fluidization behavior of the metal catalyst particles 402 is affected, and the metal catalyst particles 402 (and thereby the nanotubes 404) are drawn towards electrode 701 where the concentration of the nanotubes increases and the distance between adjacent nanotubes decreases. The conical shape of second zone 414 also promotes the decrease in distance between adjacent nanotubes. Such increased concentration of nanotubes and decreased distance between nanotubes near or on electrode 701 promotes bundling of the nanotubes 404 since the nanotubes are in closer proximity to each other and more susceptible to van der Waals attraction between adjacent nanotubes. In accordance with this embodiment, the voltage applied to the electrode can be pulsed so that the electrode has periods where no voltage is applied thereto. Such periods of no voltage can be implemented to provide sufficient time for a sufficient number of nanotubes to form prior to forming the electric field to promote the bundling of such nanotubes and the absence of an electric field promotes the release of formed bundled nanotubes 250 from the effect of the electric field, making them available to form a pellicle as described above. In an alternative embodiment, electrode 701 of FIGS. 7 and 7A can be incorporated into reactor 410 of FIGS. 4A-4C or reactor 610 of FIG. 6. When implemented in reactor 410, electrode 701 is provided with apertures that mate with the apertures 421 of reactor 410. In accordance with some embodiments of the present disclosure, reactor 710 can be provided with nozzles 601 described above with reference to reactor 610.

Referring additionally to FIG. 3, fabrication of a pellicle membrane assembly 230 using reactor 710 for forming bundled nanotubes, in accordance with some embodiments of the present disclosure proceeds with step 301 described above. Within reactor 710, step 302 forms nanotube bundles by promoting oblique flow of the nanotubes and bundles of nanotubes in lower portion 414*b* of second zone 414 utilizing the conical shape of second zone 414. Such oblique flow promotes formation of nanotubes as described above. Formation of nanotube bundles is further promoted by forming an electric field within reactor 710 utilizing electrodes 701. In some embodiments, formation of nanotube bundles is promoted by pulsing the formation of the electric field as described above. Method 300 then proceeds with steps 306, 308 and 310 to form a pellicle membrane in accordance with the discussion above.

Figure 8:
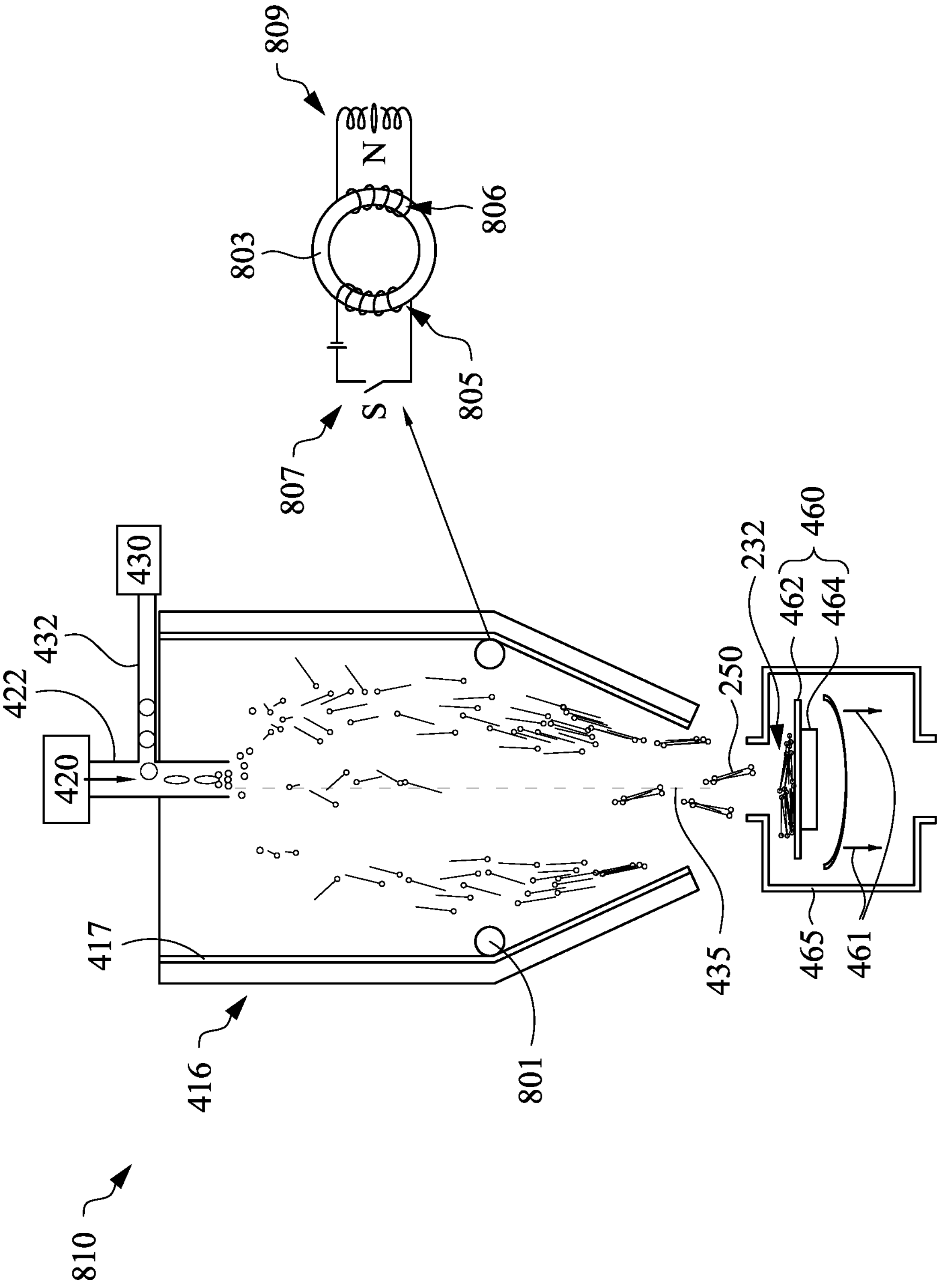
FIG. 8 illustrates nanotube bundle formation and pellicle membrane assembly therefrom at various stages of the method of FIG. 3 using a reactor in accordance with alternative embodiments of the present disclosure.

FIG. 8 illustrates another aspect of the present disclosure. FIG. 8 is a reproduction of the reactor structure described above with reference to FIG. 5. Elements of reactor 810 in FIG. 8 which are identical to elements of reactor 510 in FIG. 5 are identified by the same reference numerals in FIG. 8 as the reference numbers used to identify those elements in FIG. 5. Embodiments of FIG. 8, include a source of an electromagnetic field 801, such as an electromagnet, near the interface between the first reaction zone 412 and the second zone 414. Embodiments of the present disclosure are not limited to the source of electromagnetic field 801 being located at or near the interface between the first reaction zone 412 and the second zone 414. For example, in other embodiments, the source of electromagnetic field 801 can be above or below the interface between the first reaction zone 412 and the second zone 414. In an embodiment, the source of an electromagnetic field 801 includes a conductive core or pole 803 around which conductive windings 805 and 806 are wound. Conductive windings 805 are connected to a switch 807. Conductive windings 806 are connected to a power source. Powering of the electromagnet causes the electromagnet to produce an electromagnetic field in the vicinity of the electromagnet. As illustrated in FIG. 8, when the source of an electromagnetic field 801 is activated, the resulting electromagnetic field is generated. When the source of an electromagnetic field 801 is not activated, no magnetic field is generated. In the embodiment of FIG. 8, the source of an electromagnetic field 801 is illustrated as having a ring shape. Embodiments in accordance with the present disclosure are not limited to the source of an electromagnetic field having a ring shape. For example, in other embodiments, the source of an electromagnetic field 801 can have a shape that is not ring shaped. For example, the source of an electromagnetic field can be a conductive plate wrapped in coils and provided in a location similar to the location where electrode 701 in FIGS. 7 and 7A is located. When the electromagnetic field is present, the fluidization behavior of the metal catalyst nanoparticles 402 are affected the metal catalyst nanoparticles 402 (and thereby the nanotubes 404) are drawn towards the source of the electromagnetic field 801 where the concentration of the nanotubes increases and the distance between adjacent nanotubes decreases. The conical shape of second zone 414 also promotes the decrease in distance between adjacent nanotubes. Such increased concentration of and decreased distance between nanotubes caused by the source of the electromagnetic field 801 and conical shape of the second zone 414 promotes bundling of the nanotubes 404 since the nanotubes are in closer proximity to each other and more susceptible to van der Waals attraction between adjacent nanotubes. In accordance with this embodiment, the power applied to the source of the electromagnetic field 801 can be pulsed so that the source of the electromagnetic field 801 has periods where no electromagnetic field is present. Such periods of no electromagnetic field can be implemented to provide sufficient time for a sufficient number of nanotubes to form prior to forming the electromagnetic field to promote the bundling of such nanotubes and the absence of the electromagnetic field promotes the release of formed bundled nanotubes 250 from the effect of the electromagnetic field, making them available to form a pellicle as described above. In an alternative embodiment, source of electromagnetic field 801 of FIG. 8 can be incorporated into reactor 410 of FIGS. 4A-4C, reactor 510 of FIG. 5, reactor 610 of FIG. 6 and reactor 710 of FIG. 7. In accordance with some embodiments of the present disclosure, reactor 810 can be provided with nozzles 601 described above with reference to reactor 610.

Referring additionally to FIG. 3, fabrication of a pellicle membrane assembly 230 using reactor 810 for forming bundled nanotubes, in accordance with some embodiments of the present disclosure proceeds with step 301 described above. Within reactor 810, step 302 forms nanotube bundles by promoting oblique flow of the nanotubes and bundles of nanotubes in lower portion 414*b* of second zone 414 utilizing the conical shape of second zone 414. Such oblique flow promotes formation of nanotubes as described above. Formation of nanotube bundles is further promoted by forming an electric field utilizing electrodes 701. In some embodiments, formation of nanotube bundles is promoted by pulsing the formation of the electric field as described above. Method 300 then proceeds with step 306, 308 and 310 to form a pellicle membrane in accordance with the discussion above.

As illustrated in FIG. 9, the source of electromagnetic field 801 described above with reference to FIG. 8 is implemented in the reactor 410 of FIGS. 4A-4C to provide the reactor 910 illustrated in FIG. 9. In such implementation, the description above regarding the source of electromagnetic field 801 with reference to FIG. 8 is equally to the implementation of source of electromagnetic field 801 in reactor 910.

Referring additionally to FIG. 3, fabrication of a pellicle membrane assembly 230 using reactor 910 for forming bundled nanotubes, in accordance with some embodiments of the present disclosure proceeds with step 301 described above. Within reactor 910, step 302 forms nanotube bundles by promoting oblique flow of the nanotubes and bundles of nanotubes in lower portion 414*b* of second zone 414 utilizing the gas flow through apertures 421 and the conical shape of second zone 414. Such oblique flow promotes formation of nanotubes as described above. Formation of nanotube bundles is further promoted by forming an electromagnetic field with a source of electromagnetic field 801 as described above. Method 300 then proceeds with steps 306, 308 and 310 to form a pellicle membrane in accordance with the discussion above.

Referring to FIG. 10, in another embodiment of the present disclosure, reactor 410 of FIGS. 4A-4C is modified so that a second zone 1014 is not conical in shape (i.e., where its inner diameter decreases from its upper end to its lower end), but is instead cylindrical in shape having a constant inner diameter. In addition, reactor 1010 includes a plurality of rings of apertures wherein the location of the apertures in a respective ring of apertures is offset from the location of apertures in another ring of apertures as described below in more detail. Like reactor 410, reactor 1010 includes first reaction zone 1012 (similar to first reaction zone 412 in FIGS. 4A-4C) above second zone 1014, liner 1017 (similar to liner 417 in FIGS. 4A-4C), partition structure 1019 (similar to partition structure 419 in FIGS. 4A-4C), plenum 1023 (similar to plenum 423 in FIG. 4A-4C) between liner 1017 and partition structure 1019 and heating element 1016 (similar to heating element 416 in FIGS. 4A-4C). In the embodiment illustrated in FIG. 10, second zone 1014 of reactor 1010 includes a plurality of rings of apertures 1021*a*-1021*x*, where x is an integer. Each ring of apertures is defined by at least one aperture lying in a common plane, for example a horizontal plane in FIG. 10, with another aperture. In the embodiment of FIG. 10, details of the location of apertures 1021 in rings of apertures 1021*a* and 1021*b* are illustrated. Rings of apertures 1021*a* and 1021*b* are illustrated as each including four apertures; however, in accordance with other embodiments, rings of apertures 1021*a* and 1021*b* can have more than four apertures or less than four apertures. In this embodiment of FIG. 10, the locations of apertures 1021 in ring 1021*a* are angularly offset by 22.5 degrees from locations of apertures 1021 in ring 1021*b*. Embodiments in accordance with the present disclosure are not limited to the foregoing angular offset between apertures of different rings of apertures. For example, the angular offset between apertures of different rings of apertures can be greater than 22.5° or less than 22.5°. In some embodiments, apertures 1021 are round and have a diameter of 0.1 cm to 10 cm. In other embodiments, apertures 1021 have a diameter that is greater than 10 cm. In other embodiments, apertures 1021 are not round, for example they have a polygonal or oval shape. The rings of apertures 1021*a*-1021*x* of this embodiment can also be implemented in the embodiment of FIGS. 4A-4C and 9 described above.

Referring additionally to FIG. 3, fabrication of a pellicle membrane assembly 230 using reactor 1010 for forming bundled nanotubes, in accordance with some embodiments of the present disclosure proceeds with step 301 described above. Within reactor 1010, step 302 forms nanotube bundles by flowing inert gas through the rings of apertures 1021*a*-1021*x* into the interior of reactor 1010 and at the nanotubes. This flow of inert gas causes the nanotubes to concentrate near the centerline of the reactor 1010. Such concentration brings the individual nanotubes into closer proximity, where van der Waal forces can cause the individual nanotubes to bundle together. Method 300 then proceeds with step 306, 308 and 310 to form a pellicle membrane in accordance with the discussion above.

Figure 11:
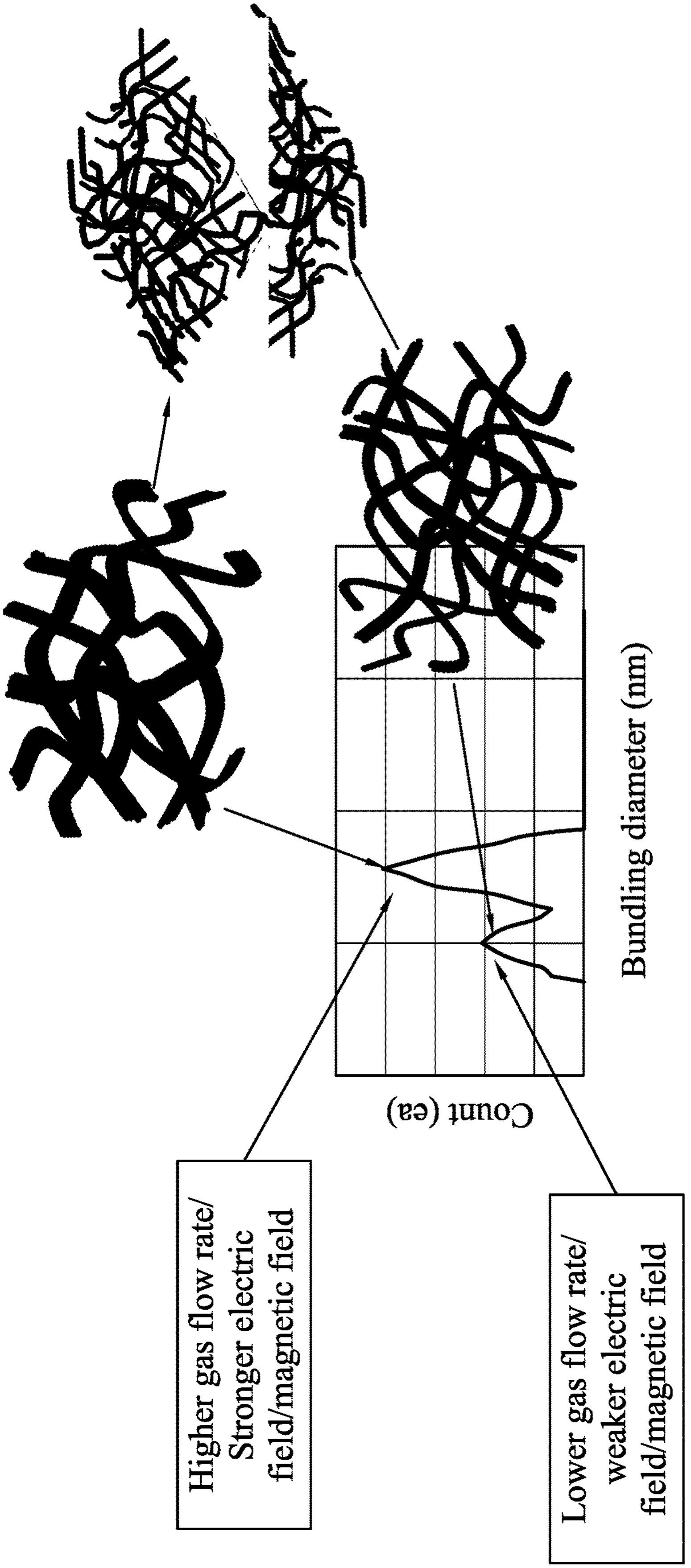
FIG. 11 schematically illustrates layers of nanotube bundles exhibiting differing distributions of nanotube bundle diameters in accordance with embodiments of the present disclosure.

FIG. 11 illustrates how methods carried out in accordance with the present disclosure in reactors in accordance with the present disclosure can produce bundles of nanotubes having different distributions of bundle dimensions, e.g., bundle diameters. In accordance with FIG. 11, the bundling diameter of nanotube bundles can be increased by causing a higher flow rate of inert gas to pass through the apertures of reactors 410, 910 or 1010 or causing a higher flow rate of inert gas to exit from nozzles 601 of reactor 610. Such higher flow rates of inert gas through the apertures of these reactors promote an increased degree of bundling of the individual nanotubes, thus resulting in nanotube bundles of greater diameter. In reactors 710, 810, and 910, the bundling diameter of nanotube bundles can be increased by increasing the strength of the electric or electromagnetic field. Such stronger electric or electromagnetic fields promote an increased degree of bundling of the individual nanotubes, thus resulting in nanotube bundles of greater diameter. Conversely, if nanotube bundles of lesser diameters are desired, the flow rate of the inert gas, the strength of the electric field or the strength of the electromagnetic field can be reduced. With this understanding of the effect of the flow rate of the inert gas, the effect of the strength of the electric field and the effect of the strength of the electromagnetic field, operation of the reactors described herein can be controlled during the production of a pellicle such that the pellicle consists of multiple layers of bundled nanotubes, wherein the nanotube bundles of the respective layers exhibit different distributions of nanotube bundle diameters or dimensions. For example, nanotubes bundles of one layer can exhibit a bundled nanotube diameter distribution across a 10 nm band that includes a peak count of bundled nanotubes of a specific diameter at the center of the 10 nm band. In accordance with embodiments of the present disclosure, layers of nanotube bundles exhibiting such 10 nanometer band can be produced across a range of nanotube bundle diameters that includes 15 nm to 55 nm. In other embodiments, the process can be controlled to produce a layer of nanotubes bundles that exhibits a bundled nanotube diameter distribution across a 20 nm band that includes a peak count of bundled nanotubes of a specific diameter at the center of the 20 nm band. In accordance with embodiments of the present disclosure, layers of nanotube bundles exhibiting such 20 nm band can be produced across a range of nanotube bundle diameters that includes 10 nm to 60 nm.

In alternative embodiments, the gas flow rate and/or the strength of the electric or electromagnetic fields can be controlled in different time periods to produce a single layer of bundled nanotubes which includes a distribution of different sized nanotube bundles exhibiting two or more peaks. For example, in accordance with embodiments of the present disclosure, a layer of bundled nanotubes exhibiting a distribution of nanotube bundle diameters that exhibits two peaks within an approximate 20 nm band of nanotube bundle diameters can be produced. In some embodiments, layers of nanotube bundles exhibiting such 20 nm band can be produced across a range of nanotube bundle diameters that includes 15 nm to 65 nm. In other embodiments, a layer of bundled nanotubes exhibiting a distribution of nanotube bundle diameters that exhibits two peaks within an approximate 35 nm band of nanotube bundle diameters can be produced. In some embodiments, layers of nanotube bundles exhibiting such 35 nm band can be produced across a range of nanotube bundle diameters that includes 10 nm to 75 nm. In accordance with some embodiments of the present disclosure, a layer of bundled nanotubes exhibiting a distribution of nanotube bundle diameter that exhibits two peaks within an approximate 25 nm band can be produced. In some embodiments, such 25 nm band falls within a range of bundle diameters of 15 nm to 70 nm. In other embodiments, a layer of bundled nanotubes exhibiting a distribution of nanotube bundles diameters that exhibits two peaks within an approximate the 50 nm band can be produced. In some embodiments, such 50 nm band falls within a range of bundle diameters ranging from 10 nm to 75 nm. In some embodiments, the different peaks are of the same magnitude (counts), while in other embodiments, the different peaks are of different magnitudes (counts).

One aspect of this description relates to methods for forming a pellicle for use in an extreme ultraviolet lithography mask. The method includes forming a pellicle membrane over a filter membrane. Forming the pellicle membrane includes growing carbon nanotubes from metal catalyst particles in a first reaction zone of a reactor which includes an axial centerline. The nanotubes include one of the metal catalyst particles at a growing tip of the nanotubes. The carbon nanotubes are flowed in a direction substantially parallel to the axial centerline of the reactor and then the direction of the carbon nanotubes is altered to be different than a direction that is substantially parallel to the axial centerline of the reactor. The carbon nanotubes are combined into carbon nanotube bundles and collected on a filter membrane. The formed pellicle membrane is transferred from the filter membrane to a membrane border.

Another aspect of this description relates to methods for forming a pellicle for an extreme ultraviolet lithography mask that includes forming a pellicle membrane over a filter membrane. Formation of the pellicle membrane includes growing individual carbon nanotubes from in situ formed metal catalyst particles in a first reaction zone of a reactor that includes an axial centerline. Each of the grown carbon nanotubes includes a metal catalyst particle at a growing tip of the grown individual carbon nanotubes. The grown individual carbon nanotubes are flowed in a direction substantially parallel to the axial centerline of the reactor. In a second zone of the reactor below the first reaction zone, the direction of the flow of the grown individual carbon nanotubes is altered by exposing the grown individual carbon nanotubes to an electric or magnetic field. The grown individual carbon nanotubes are combined into carbon nanotube bundles which are collected on a filter membrane. The pellicle membrane is transferred from the filter membrane to a membrane border.

Still another aspect of this description relates to systems for forming a pellicle for a lithography photomask. The systems include a first gas supply unit and a first source material supply unit which are in fluid communication with a reactor. The reactor includes a first end and a second end opposite to the first end, the first end of the reactor in fluid communication with the first gas supply unit and the first source material supply unit. The reactor includes a first reaction zone which includes the first end and a second zone including the second end. The second zone is located beneath the first reaction zone and the first reaction zone is connected to the second zone at a location intermediate the first end and the second end. The second zone extends from the intermediate location to the second end and the second zone has a conical shape therebetween. The second end is open.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a pellicle for an extreme ultraviolet lithography mask, comprising:
- forming a pellicle membrane over a filter membrane, wherein forming the pellicle membrane comprises:
  - growing carbon nanotubes (CNTs) from metal catalyst particles in a first reaction zone of a reactor, the reactor including an axial centerline, each of the CNTs including one of the metal catalyst particles at a growing tip of the CNTs;
  - flowing the CNTs in a direction substantially parallel to the axial centerline of the reactor;
  - altering the direction the CNTs are flowing to a direction that is different than the direction that is substantially parallel to the axial centerline of the reactor;
  - combining the CNTs into CNT bundles; and
  - collecting the CNT bundles on the filter membrane; and
- transferring the pellicle membrane from the filter membrane to a membrane border.

2. The method of claim 1, wherein the pellicle membrane comprises less than 0.01 atomic % of the metal catalyst particles.

3. The method of claim 1, wherein the altering the direction the CNTs are flowing includes altering the direction the CNTs are flowing to a direction that is oblique to the substantially parallel direction.

4. The method of claim 1, wherein growing the CNTs comprises:
- supplying a feedstock comprising a carbon source, a catalyst precursor and a catalyst promoter carried by a carrier gas into the first reaction zone of the reactor;
- heating the first reaction zone of the reactor to maintain a temperature gradient along a length of the first reaction zone;
- decomposing the catalyst precursor to thereby form the metal catalyst particles; and
- catalyzing, by the metal catalyst particles, decomposition of the carbon source to provide carbon atoms and growth of individual CNTs from the metal catalyst particles.

5. The method of claim 3, wherein the altering the direction the CNTs are flowing includes directing an inert gas towards the axial centerline of the reactor.

6. The method of claim 5, wherein directing an inert gas towards the axial centerline of the reactor includes flowing the inert gas through apertures formed in a liner of the reactor.

7. The method of claim 5, wherein directing an inert gas towards the axial centerline of the reactor includes injecting the inert gas into the reactor through one or more nozzles.

8. The method of claim 1, wherein the altering the direction the CNTs are flowing includes deflecting the flow of the CNTs by a portion of the reactor that has a conical shape.

9. The method of claim 1, wherein the altering the direction the CNTs are flowing includes creating an electric field or magnetic field within the reactor.

10. A method for forming a pellicle for an extreme ultraviolet lithography mask, comprising:
- forming a pellicle membrane over a filter membrane, wherein forming the pellicle membrane comprises:
  - growing individual carbon nanotubes (CNTs) from in-situ formed metal catalyst particles in a first reaction zone of a reactor, the reactor including an axial centerline, each of the grown individual CNTs including a metal catalyst particle at a growing tip of the grown individual CNTs;
  - flowing the grown individual CNTs in a direction substantially parallel to the axial centerline of the reactor;
  - in a second zone of the reactor below the first reaction zone, altering a direction of the flow of the grown individual CNTs by exposing the grown individual CNTs to an electric or magnetic field;
  - combining the grown individual CNTs into CNT bundles; and
  - collecting the CNT bundles on the filter membrane; and
- transferring the pellicle membrane from the filter membrane to a membrane border.

11. The method of claim 10, wherein the altering a direction of the flow of the grown individual CNTs further includes energizing a conical electrode in the second zone of the reactor.

12. The method of claim 11, wherein the energizing a conical electrode in the second zone of the reactor includes applying a pulsed voltage to the conical electrode.

13. The method of claim 12, wherein the combining the grown individual CNTs into CNT bundles occurs during a period of applying the pulsed voltage to the conical electrode.

14. The method of claim 12, wherein the combining the grown individual CNTs into CNT bundles includes attracting grown individual CNTs towards the conical electrode.

15. The method of claim 10, wherein the altering the direction of the flow of the grown individual CNTs further includes generating a magnetic field in the reactor using an electromagnet.

16. The method of claim 15, wherein the combining the grown individual CNTs into CNT bundles includes concentrating the grown individual CNTs by subjecting the metal catalyst particle of the grown individual CNTs to the magnetic field.

17. A method for forming a pellicle for an extreme ultraviolet lithography mask, comprising:

forming a plurality of carbon nanotubes (CNTs) in a first reaction zone of a reactor;

flowing the plurality of CNTs from the first reaction zone to a second reaction zone of the reactor located downstream of the first reaction zone along a first direction;

flowing the plurality of CNTs through the second reaction zone along a second direction different from the first direction to exit the reactor, wherein, in the second reaction zone, the plurality of CNTs are initially separate and are caused to come together and bundle in response to the change in flow direction to form a plurality of CNT bundles; and collecting the plurality of CNT bundles on a substrate to form a pellicle membrane.

18. The method of claim 17, further comprising applying an electric field to the CNTs while the CNTs flow through the second reaction zone to promote bundling.

19. The method of claim 17, further comprising applying an electromagnetic field to the CNTs while the CNTs flow through the second reaction zone to promote bundling.

20. The method of claim 17, further comprising flowing an inert gas into the second reaction zone to promote bundling of the CNTs.

* * * * *